(12) United States Patent
Kono

(10) Patent No.: US 6,426,671 B1
(45) Date of Patent: Jul. 30, 2002

(54) INTERNAL VOLTAGE GENERATING CIRCUIT

(75) Inventor: Takashi Kono, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/759,318

(22) Filed: Jan. 16, 2001

(30) Foreign Application Priority Data

Jul. 18, 2000 (JP) ........................................ 2000-217190

(51) Int. Cl.[7] .............................. G05F 1/10; G05F 3/02
(52) U.S. Cl. ...................................... 327/541; 327/512
(58) Field of Search ................................ 327/512, 513, 327/538, 540, 541, 543

(56) References Cited

U.S. PATENT DOCUMENTS

| | | | | |
|---|---|---|---|---|
| 5,448,199 A | * | 9/1995 | Park .............................. | 327/546 |
| 5,734,292 A | * | 3/1998 | Shirai et al. ................. | 327/541 |
| 6,020,781 A | * | 2/2000 | Fujioka ........................ | 327/142 |
| 6,175,266 B1 | * | 1/2001 | Sharpe-Geisler ............. | 327/541 |
| 6,333,370 B2 | * | 12/2001 | Kono et al. .................. | 323/313 |

OTHER PUBLICATIONS

"A Precharged–Capacitor–Assisted Sensing (PCAS) Scheme with Novel Level Controller for Low Power DRAMs", T. Kono et al., 1999 Symposium on VLSI Circuits Digest of Technical Papers, pp. 123–124.

"An Experimental 256–Mb DRAM with Boosted Sense–Ground Scheme", M. Asakura et al., IEEE Journal of Solid–State Circuits, vol. 29, No. 11, Nov. 1994, pp. 1303–1309.

* cited by examiner

*Primary Examiner*—Terry D. Cunningham
*Assistant Examiner*—Quan Tra
(74) *Attorney, Agent, or Firm*—McDermott, Will & Emery

(57) ABSTRACT

According to a reference voltage generated by a reference voltage generating circuit, a level shift circuit generates a control voltage with its level shifted from the reference voltage by a threshold voltage of a difference detection transistor. According to this control voltage, the difference detection transistor operates in a source follower mode to adjust a charged voltage of a capacitance element according to a voltage level of an internal voltage line. A current is supplied from a current drive circuit to the internal voltage line according to the charged voltage. In this way, an internal voltage is generated having a constant voltage level over a wide temperature range with a small occupying area and a small current consumption.

14 Claims, 10 Drawing Sheets

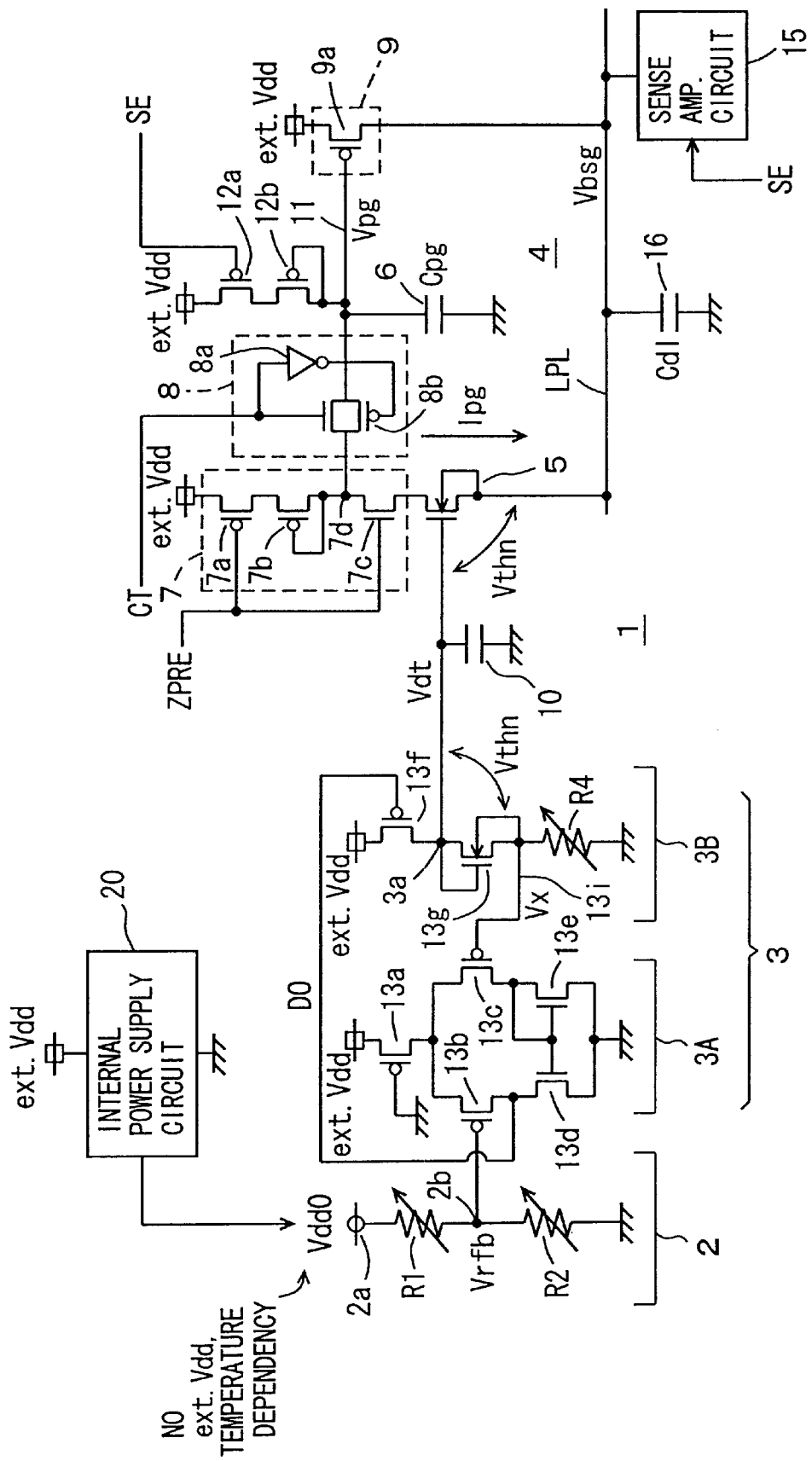
F I G. 1

INTERNAL VOLTAGE GENERATING CIRCUIT

BACKGROUND OF THE INVENTION

1. Field of the Invention

The present invention relates to an internal voltage generating circuit for generating an internal voltage of a level between the levels of an external supply voltage and a ground voltage. Specifically, the present invention relates to an internal voltage generating circuit for generating a temperature-independent internal voltage. More specifically, the invention relates to a configuration of a circuit for generating an internal voltage determining a voltage level of data stored in a memory cell in a semiconductor memory device.

2. Description of the Background Art

With recent developments of computers and information processing terminals, requirements are becoming severer for memories employed as main memories in these devices and equipment. Specifically, in addition to a large storage capacity, speed-up of an effective data transfer rate as well as reduction of power consumption are strongly required for application to portable equipment. To consider, as an example, DRAMs (Dynamic Random Access Memories) used most widely as main memory devices, DRAMs capable of transferring data at a high clock rate, such as an SDRAM (Synchronous DRAM) inputting/outputting data synchronously with a clock signal and a DDR (Double Data Rate) SDRAM inputting/outputting data synchronously with both of the rising and falling edges of a clock signal, are coming into wide use.

In a DRAM, information is stored in the form of charges in a capacitor of a memory cell. If data of H (high) level written in a DRAM cell is left as it is, the data would be lost in the course of time due to a leakage current. Therefore, a periodic restoring operation called refresh is required in DRAMs.

For recent DRAMs, an operation referred to as self refresh is defined by specifications. In this self refresh operation mode, an internal timer provided in a DRAM automatically sets a refresh timing, and the refresh operation is automatically carried out according to this refresh timing. The self refresh operation is performed in a standby period in which no access is made to the DRAM. Accordingly, reduction of a self refresh current consumed in the refresh operation can decrease current consumption of the DRAM and thus extend the life of a battery in a battery-driven information communication terminal of a portable type, for example, thereby to lengthen a continuous standing-by time.

In order to reduce the self refresh current, data holding characteristics of a memory cell should be improved to extend an interval Tsrc between refresh operations. In terms of manufacturing process, the improvement is accomplished by: (1) using a material of a high dielectric constant as an insulating film for a memory cell capacitor or devising a shape of the memory cell capacitor for increasing the capacitance value of the memory cell capacitor, and (2) reducing an off-leakage (subthreshold leakage) current Ilb of a memory cell transistor and a leakage current Ils in a PN junction between a memory cell capacitor electrode and a semiconductor substrate.

In terms of circuit design, the data holding characteristics of the memory cell can be improved by devising a power supply arrangement in a memory cell array. As one of approaches for improvement in terms of the circuit design, a BSG (Boosted Sense ground) scheme is proposed by Asakura et al. Details of the BSG scheme are described, for example, in IEEE Journal of Solid-State Circuits, 1994, pp. 1303–1309. A brief description is given below of principles of the BSG scheme.

FIG. 16 schematically shows a cross sectional structure of a memory cell of a conventional DRAM. In FIG. 16, the memory cell includes high-concentration N type impurity regions 502a and 502b formed at a surface of a semiconductor substrate 500 with an interval therebetween, a conductive layer 504 formed on the channel region between impurity regions 502a and 502b with a gate insulating film 503 underlaid, and a conductive layer 505 connected electrically to impurity region 502a. On these conductive layers 504 and 505, interlayer insulating films 506a and 506b of a double layer structure are formed. Conductive layers 504 and 505 provide a word line WL and a bit line BL, respectively.

The memory cell further includes a conductive layer 510 connected electrically to impurity region 502b via a contact hole formed in interlayer insulating films 506a and 506b, and a conductive layer 514 arranged facing to the top of conductive layer 510. Conductive layer 510 is formed having a V-shaped cross section, and conductive layer 514 includes a protrusion 514a extending into the V-shaped region at the upper region of conductive layer 510 with a capacitor insulating film 512 interposed therebetween. Conductive layer 510 functions as a connection node between an access transistor and a memory cell capacitor of the memory cell, i.e., a storage node SN. The memory cell capacitor Cs is formed in the region where conductive layers 510 and 514 face each other via capacitor insulating film 512.

It is assumed that, in the memory cell shown in FIG. 16, word line WL is maintained at a ground voltage GND level, a bit line voltage Vbl is applied to bit line BL, and a voltage Vch corresponding to H level data is held on storage node SN. A cell plate voltage Vcp (a voltage between the voltages corresponding to H level data and L level data) is applied to conductive layer 514 serving as a cell plate electrode layer CP.

Main leakage sources in the memory cell are: (1) a substrate leakage current Ils flowing to P type substrate 500 via the PN junction between impurity region 502b and P type substrate 500 in memory cell capacitor Cs, and (2) a leakage current Ilb flowing toward bit line BL that is determined by subthreshold characteristics of the access transistor.

The magnitude of leakage current Ils to P type substrate 500 depends on a potential difference Vpn applied across the PN junction between impurity region 502b and P type substrate 500. A greater potential differential Vpn increases leakage current Ils. In FIG. 16, the voltage on storage node SN is voltage Vch corresponding to H level data and a bias voltage Vbb is applied to P type substrate 500. Accordingly, the potential difference Vpn is represented by the following expression.

$$Vpn = Vch - Vbb$$

Leakage current Ilb flowing toward bit line BL via the access transistor is represented by the following expression using a difference between a gate-source voltage Vgs of the access transistor and a threshold voltage Vth.

$$Ilb = Ilb0 \cdot 10^{\wedge}[(Vgs - Vth)/S] \quad (1)$$

Here, "^" represents power. In expression (1), Ilb0 represents a current value defining threshold voltage Vth, and S is a coefficient determined by the transistor structure and the process and is represented by dVgs/dlogId. Here, Id represents a drain current. Expression (1) indicates that the bit line leakage current Ilb is strongly dependent on a gate-source voltage of an access transistor MT. The value of the leakage current Ilb becomes worst when the bit line is at L level. In a conventional case, the L level is equal to ground voltage GND level.

It seems from expression (1) that leakage current Ilb is independent of voltage Vbl of bit line BL connected to the access transistor. However, threshold voltage Vth depends on a substrate-source voltage Vbs=Vbb−Vbl. If bias voltage Vbb is a non-positive voltage and the bit line voltage or source voltage Vbl is lower, the absolute value of substrate-source voltage Vbs is smaller and threshold voltage Vth is also smaller.

For example, in a memory block to be refreshed, if a memory cell among the memory cells connected to a non-selected word line has an associated bit line swung to a voltage corresponding to L level data, an access transistor of the memory cell connected to the non-selected word line has substrate-source voltage Vbs smaller in absolute value, and bit line leakage current Ilb increases even if the non-selected word line WL has ground voltage GND level. As understood from the above expression (1), even if threshold voltage Vth slightly deviates by merely 0.1 V, bit line leakage current Ilb varies about tenfold since generally S factor is of the order of 0.1 V.

In order to reduce bit line leakage current Ilb, it can be considered that bias voltage Vbb of P type substrate 500 is made negative as shown in FIG. 17A. By setting substrate bias voltage Vbb at a value which is great in the negative direction, the absolute value of substrate-source voltage Vbs can be increased. Accordingly, threshold voltage Vth of the memory cell access transistor MT can be increased to reduce bit line leakage current Ilb.

However, voltage difference Vpn (=Vch−Vbb) applied across the PN junction between impurity region 502b and P type substrate 500 increases and accordingly substrate leakage current Ils increases. A sense supply voltage Vdds determines the voltage level of voltage Vch corresponding to H level data on storage node SN. If substrate leakage current Ils increases because of this deeper negative substrate bias, when sense supply voltage Vdds is decreased, it is difficult to hold H level data over a long period of time.

According to the BSG scheme, in order to simultaneously reduce both of the bit line leakage current Ilb and substrate leakage current Ils, a voltage of L level data or sense ground voltage is set at a voltage Vbsg slightly higher than ground voltage GND as shown in FIG. 17B. A bias voltage to the P type substrate (backgate of access transistor) is set at ground voltage GND level. Word line WL is at ground voltage GND level when it is not selected. Gate-source voltage Vgs of access transistor MT is thus a negative voltage, −Vbsg. Therefore, from expression (1), it is clear that bit line leakage current Ilb exponentially decreases in BSG scheme. As ground voltage GND is applied to the P type substrate (backgate), voltage difference Vpn applied across the PN junction between impurity region 502b and P type substrate 500 corresponding to storage node SN is equal to voltage Vch of H level data. The voltage difference applied across the PN junction can be made smaller and accordingly substrate leakage current Ils can be reduced.

In other words, gate-source voltage Vgs of access transistor MT can be set at a negative value without applying a negative voltage to P type substrate 500. In addition, voltage Vbs applied across the PN junction between source impurity region 502a of access transistor MT and P type substrate 500 is in a reverse-bias state. Thus, both of bit line leakage current Ilb and substrate leakage current Ils can be reduced. This reduction of the leakage currents improves charge holding characteristics of the memory cell and thus refresh interval Tsrc can be lengthened to reduce the refresh current.

The BSG scheme is highly effective on the improvement of refresh characteristics. However, if the BSG scheme is actually employed, the most important issue is generation and retention of a stable boosted sense ground voltage Vbsg. Not only the accuracy in level of boosted sense ground voltage Vbsg generated in a sense operation, but also the holding of the voltage level of boosted sense ground voltage Vbsg in the period during which a sense amplifier circuit is activated, are required. As discussed above, threshold voltage Vth of the access transistor is determined by voltage Vbs=Vbb−Vbl and bit line leakage current Ilb is determined according to the above expression (1). If bit line voltage Vbl decreases due to leakage and the like, bit line leakage current Ilb is increased and accordingly data retention characteristics of a memory cell would deteriorate.

A circuit for holding the level of boosted sense ground voltage Vbsg is already disclosed specifically by the inventor of the present invention in, 1999 Symposium on VLSI Circuits Digests of Technical Papers, "A Precharged-Capacitor-Assisted Sensing (PCAS) Scheme with Novel Level Controller for Low Power DRAMs", T. Kono et al., pp. 123–124.

FIG. 18A shows a structure of a boosted sense ground voltage generating circuit shown in the reference mentioned above. Referring to FIG. 18A, the boosted sense ground voltage generating circuit 1 includes a reference voltage generating circuit 2 generating a reference voltage Vrfb, a level shift circuit 3 receiving reference voltage Vrfb from reference voltage generating circuit 2 and shifting the level thereof to generate a control voltage Vdt (=Vrfb+Vthp), an N channel MOS transistor 5 detecting a difference between control voltage Vdt from level shift circuit 3 and a voltage Vbsg on a low level sense supply line LPL to flow a current Ipg according to the detected voltage difference, a capacitance element 6 with its charging voltage adjusted by discharging current Ipg of difference detection MOS transistor 5, a precharge circuit 7 precharging capacitance element 6 to a predetermined voltage, a charge holding circuit 8 for holding charges stored in capacitance element 6, and a current drive circuit 9 according to charged voltage Vpg of capacitance element 6 to supply a current from an external supply node to low level sense supply line LPL.

Reference voltage generating circuit 2 includes variable resistance elements R1 and R2 connected in series between a node receiving an internal reference voltage (e.g. array supply voltage) Vdd0 which is independent of an external supply voltage and a ground node. Reference voltage Vrfb is output from the connection node connecting variable resistance elements R1 and R2.

Level shift circuit 3 includes a resistance element R3 and a P channel MOS transistor 3p connected in series between the internal power supply node and the ground node. Resistance element R3 has its resistance value set sufficiently higher than a channel resistance (ON resistance) of P channel MOS transistor 3p. Therefore, P channel MOS transistor 3p receives, at its gate, reference voltage Vrfb to operate in a source-follower mode and keep its source-gate voltage at the voltage level of the absolute value Vthp of the threshold voltage thereof. Level shift circuit 3 is merely required to charge the gate capacitance of difference detection MOS transistor 5 and the resistance value of resistance element R3 is increased to accordingly reduce current consumption.

MOS transistor 5 has its gate connected to an output node of level shift circuit 3 and its source connected to low level sense supply line LPL. When the difference between control voltage Vdt from level shift circuit 3 and voltage Vbsg on low level sense supply line LPL becomes greater than a threshold voltage Vthn, MOS transistor 5 is turned on to cause current Ipg to flow. A stabilization capacitance 10 for stabilizing gate voltage (control voltage) Vdt of MOS transistor 5 is provided at the gate of MOS transistor 5.

Precharge circuit 7 includes P channel MOS transistors 7a and 7b connected in series between an external supply node receiving an external supply voltage extVdd and a node 7d, and an N channel MOS transistor 7c connected between node 7d and MOS transistor 5. MOS transistors 7a and 7c receive, at the respective gates, a precharge instruction signal ZPRE and are turned on complementarily to each other. P channel MOS transistor 7b has its gate and drain connected to node 7d, operates in a diode mode, and causes voltage drop corresponding to the absolute value of the threshold voltage thereof.

Charge holding circuit 8 includes an inverter 8a inverting a charge transfer instruction signal CT, and a transmission gate 8b rendered conductive according to charge transfer instruction signal CT and an output signal of inverter 8a to selectively connect nodes 11 and 7d. When transmission gate 8b is non-conductive, capacitance element 6 is isolated from precharge circuit 7 and MOS transistor 5. Then, the charging and discharging path of capacitance element 6 is cut off and accordingly charges stored in capacitance element 6 are secured.

Boosted sense ground voltage generating circuit 1 further includes P channel MOS transistors 12a and 12b connected between the external supply node and a node 11. MOS transistor 12a receives, at its gate, a sense operation activation signal SE, and MOS transistor 12b has its gate connected to node 11 and operates in the diode mode. Sense operation activation signal SE is provided for activating an operation of a sense amplifier circuit 15 which operates using voltage Vbsg on low level sense supply line LPL as one operating supply voltage.

Sense amplifier circuit 15 starts its sensing operation according to sense operation activation signal SE in an active state of H level to supply a discharging current from a low level bit line to low level sense supply line LPL. A stabilization capacitance 16 for stabilizing boosted sense ground voltage Vbsg is provided to low level sense supply line LPL. An operation of the boosted sense ground voltage generating circuit shown in FIG. 18A is now described in conjunction with the operation waveforms illustrated in FIG. 18B.

Before time T0, sense operation activation signal SE is in the inactive state of L level and sense amplifier circuit 15 does not operate. In this state, MOS transistor 12a is turned on and node 11 is precharged to the voltage level of extVdd−Vthp. Voltage Vpg on node 11 causes P channel MOS transistor 9a included in current drive circuit 9 to have its gate-source voltage equal to its threshold voltage and stay in substantially off state. Here, the P channel MOS transistors have the same threshold voltages. If there is any leakage path between low level sense supply line LPL and a node of ground voltage GND, for example, the voltage level of boosted sense ground voltage Vbsg gradually decreases.

When sense operation activation signal SE is in the inactive state, precharge instruction signal ZPRE is in the active state of L level. Accordingly, in precharge circuit 7, MOS transistor 7a is turned on, MOS transistor 7c is turned off, and node 7d is precharged to the voltage level of extVdd−Vthp. Charge transfer instruction signal CT is at H level, transmission gate 8b is rendered conductive, and node 11 is precharged to the voltage level of extVdd−Vthp by precharge circuit 7. These signals ZPRE and CT are periodically activated according to activation of sense operation activation signal SE.

At the time T0, sense operation activation signal SE is driven into the active state of H level and accordingly sense amplifier circuit 15 operates to supply a discharging current to low level sense supply line LPL. Here, suppose that boosted sense ground voltage Vbsg is at a voltage level lower than reference voltage Vrfb. MOS transistor 12a is turned off in response to activation of sense operation activation signal SE and precharging operation on node 11 is completed.

At time T1, precharge instruction signal ZPRE rises to H level, MOS transistor 7a is turned off, MOS transistor 7c is turned on, and accordingly precharging operation for capacitance element 6 by precharge circuit 7 is completed. At this time, MOS transistor 12a is turned off. Node 11 is thus isolated from the external supply node.

Difference detection MOS transistor 5 is coupled to capacitance element 6 via MOS transistor 7c and transmission gate 8b. MOS transistor 5 receives, at its gate, control voltage Vdt (=Vrfb+Vthp) and at its source, boosted sense ground voltage Vbsg. Then, MOS transistor 5 is turned on when the following expression (2) is satisfied to supply current from capacitance element 6 to low level sense supply line LPL.

$$Vrfb+Vthp>Vbsg+Vthn \quad (2)$$

If threshold voltages Vthp and Vthn are equal to each other, the voltage level of boosted sense ground voltage Vbsg is controlled such that the voltage level thereof is equal to reference voltage Vrfb. Here, the absolute value Vthp of the threshold voltage is simply referred to as threshold voltage. If threshold voltages Vthp and Vthn are not equal to each other, it may suffice that reference voltage Vrfb is set at Vbsg+Vthn−Vthp.

Charges stored in capacitance element 6 are discharged via MOS transistor 5 to low level sense supply line LPL. Specifically, MOS transistor 5 discharges current according to the difference between control voltage Vdt on node 3a and boosted sense ground voltage Vbsg on low level sense supply line LPL. This discharged current changes charged voltage Vpg of capacitance element 6. Capacitance element 6 has a capacitance value Cpg which is sufficiently smaller than capacitance value Cdl of stabilization capacitance 16. The current discharged by MOS transistor 5 significantly changes the charged voltage Vpg of capacitance element 6.

At time T2, charge transfer instruction signal CT falls to L level and transmission gate 8b becomes non-conductive. At time T' between time T2 and time T1, the total charge Qpg represented by the following expression (3) flows to low level sense supply line LPL via MOS transistor 5.

$$Qpg=\int Ipg \cdot dT \quad (3)$$

Here, integration period T satisfies the relation T1<T<T'≦T2.

The voltage level of voltage Vpg on node 11 at time T' is represented by the following expression (4).

$$Vpg=extVdd-Vthp-Qpg/(Cpg+Cg) \quad (4)$$

Here, Cg represents a gate capacitance of MOS transistor 9a when MOS transistor 9a for drive is turned on and accordingly a channel is formed therein. In this current drive circuit 9, MOS transistor 9a is turned on when gate-source voltage Vgs becomes equal to the threshold voltage thereof. Specifically, when the following expression (5) is satisfied, MOS transistor 9a is turned on.

$$Vpg < extVdd - Vthp \quad (5)$$

It would be understood from the above expressions (4) and (5) that, when discharging occurs via MOS transistor 5, MOS transistor 9a for drive is immediately turned on to supply current from the external supply node to low level sense supply line LPL.

It is also understood from above expression (4) that a smaller capacitance value (Cpg+Cg) of node 11 considerably varies voltage Vpg on node 11 even if the amount of discharged charges Qpg is small. In other words, even if boosted sense ground voltage Vbsg slightly deviates from reference voltage Vrfb, discharged current Ipg via MOS transistor 5 significantly changes the voltage Vpg on node 11. Responsively, current immediately flows via drive MOS transistor 9a from the external supply node to low level sense ground line LPL to cause the voltage level of voltage Vbsg to rise.

At time T2, charge transfer instruction signal CT enters the inactive state of L level, transmission gate 8b becomes non-conductive, capacitance element 6 and MOS transistor 5 are isolated from each other, and voltage Vpg on node 11 is maintained at the voltage level attained at time T2. In this state, driving MOS transistor 9a supplies current to low level sense ground line LPL.

At time T3, precharge instruction signal ZPRE becomes active, charge transfer instruction signal CT becomes active, MOS transistor 5 is isolated from capacitance element 6, node 11 is precharged again to the voltage level extVdd−Vthp by precharge circuit 7, and accordingly, preparation is made for the subsequent voltage difference detecting operation. This operation is repeatedly performed in the period during which sense operation activation signal SE is at H level. Boosted sense ground voltage Vbsg is controlled to be equal to reference voltage Vrfb.

As discussed above, with charged voltage at the capacitance element set according to the difference between voltage Vbsg on low level sense supply line LPL and control voltage Vdt, the voltage difference can be detected with reduced current consumption to speedily suppress the variation in level of boosted sense ground voltage Vbsg.

The voltage level of boosted sense ground voltage Vbsg is lower than control voltage Vdt by threshold voltage Vthn of MOS transistor 5 for difference detection. Generally, reference voltage Vrfb is set to meet the following relation, where a target value of boosted sense ground voltage Vbsg is Vbsg (0).

$$Vrfb = Vbsg(0) + Vthn - Vthp \quad (6)$$

If threshold voltages Vthn and Vthp have the same temperature characteristics and the value of (Vthn−Vthp) is always constant, reference voltage Vrfb is independent of temperature and has a constant value over a wide temperature range. The boosted sense ground voltage can thus be maintained at a constant value over a wide temperature range. However, there arise problems that values of threshold voltages Vthn and Vthp vary due to variation of process parameters and accordingly they have different temperature characteristics. Consequently, it is difficult to maintain reference voltage Vrfb at a constant value over a wide temperature range and eliminate dependency on an operation environment such as temperature-dependency of boosted sense ground voltage Vbsg.

As a resistance element employed in reference voltage generating circuit 2, a pure resistance element such as line resistance is desirably used for avoiding the temperature dependency of reference voltage Vrfb as much as possible. However, use of such a pure resistance element causes a problem of increase in the layout area.

Not only generation of the boosted sense ground voltage, but generation of sense power supply voltage Vdds with the similar structure to that of the circuit shown in FIG. 18A accompany similar problems. Specifically, a problem generally occurs in an internal voltage generating circuit employing a scheme of controlling charges stored in a capacitor according to a difference between a target voltage and a reference voltage, the problem being the difficulty in eliminating temperature-dependency of the target voltage.

In the transition period immediately after the power is on, the control voltage cannot be set at a predetermined voltage level until reference voltage Vdd0 (voltage generated internally and not depending on the external supply voltage) becomes stable. Consequently, a problem arises that an internal voltage such as the boosted sense ground voltage cannot be set at a desired level in a short period of time.

Further, in view of application to portable equipment and the like, it is desired that a required internal voltage is generated with current consumption and occupied area as small as possible.

SUMMARY OF THE INVENTION

An object of the present invention is to provide an internal voltage generating circuit capable of generating an internal voltage of a desired voltage level in a stable manner over a wide operation range.

Another object of the invention is to provide an internal voltage generating circuit capable of generating an internal voltage kept at a constant voltage level over a wide range of temperature.

Still another object of the invention is to provide an internal voltage generating circuit capable of speedily setting an internal voltage at a desired voltage level in a transition period such as a period immediately after power is on.

A further object of the invention is to provide an internal voltage generating circuit capable of generating an internal voltage of a desired voltage level without increasing current consumption and the area occupied thereby.

An internal voltage generating circuit according to one aspect of the invention includes a reference voltage generating circuit for generating a reference voltage, a comparator for comparing the reference voltage with a voltage on a first node to generate a signal indicating a result of the comparison, a current drive transistor coupled to a first power supply node to flow a current between the second node and the first power supply node according to an output signal of the comparator, and an output circuit coupled between the current drive transistor and a second power supply node to convert the current from the current drive transistor into a voltage and generate the voltage on a second node. The output circuit includes a voltage drop element causing voltage drop of a predetermined value between the second node and the first node.

The internal voltage generating circuit according to one aspect of the invention further includes a voltage compensation circuit according to a difference between a voltage on an internal voltage line and the voltage on the second node to cause a current flow between the internal voltage line and a third power supply node.

An internal voltage generating circuit according to another aspect of the invention includes first and second capacitance elements, a precharge circuit responsive to a clock signal for storing charges of opposite polarities respectively in the first and second capacitance elements, and an equalize circuit responsive to the clock signal to become conductive complementarily to the precharge circuit and electrically connect the first and second capacitance elements to an output node. A reference voltage is generated on the output node.

An internal voltage generating circuit according to still another aspect of the invention includes a difference detection transistor generating a current according to a difference between a reference voltage and a voltage on an internal voltage line, a capacitance element with a charged voltage determined by the current generated by the difference detection transistor, a current drive transistor according to the charged voltage of the capacitance element to cause current flow between the internal voltage line and a power supply node, and a reference voltage generating circuit for generating the reference voltage. The reference voltage generating circuit generates the reference voltage to cancel temperature dependency exhibited by the voltage on the internal voltage line through the difference detection transistor.

The comparison circuit is used to drive the current drive transistor in order to generate a voltage at a level substantially equal to the reference voltage and further generate a voltage difference on this voltage for comparison with an internal voltage to adjust the level of the internal voltage. In this way, the internal voltage can be generated according to the reference voltage. Use of the voltage drop element can eliminate temperature dependency of a voltage detected when a voltage difference is detected in the voltage compensation circuit.

The reference voltage is generated using the capacitance element and accordingly the reference voltage can be generated with a small occupying area and a small current consumption.

Further, if the reference voltage is generated using the capacitance element, the period of the charging/discharging operation of the capacitance element can be shortened in a transition period to stabilize the reference voltage speedily.

In addition, for the structure in which a voltage difference is detected by means of current and this current is converted into voltage to correct the voltage level of an internal voltage, the reference voltage can be generated so as to cancel temperature dependency exhibited by the internal voltage through the difference detecting current drive transistor, and accordingly the internal voltage having a constant voltage level over a wide temperature range can be generated.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 shows a structure of an internal voltage generating circuit according to a first embodiment of the invention.

DESCRIPTION OF THE PREFERRED EMBODIMENTS

First Embodiment

FIG. 1 shows a structure of an internal voltage generating circuit 1 for generating a boosted sense ground voltage Vbsg according to the first embodiment of the invention. Referring to FIG. 1, internal voltage generating circuit 1 includes a reference voltage generating circuit 2 generating a reference voltage Vrfb, a comparison circuit 3A, and an output circuit 3B according to an output signal of comparison circuit 3A to generate a control voltage Vdt on an internal node 3a. Comparison circuit 3A and output circuit 3B correspond to level shift circuit 3 shown in FIG. 18A.

Figure 18A:
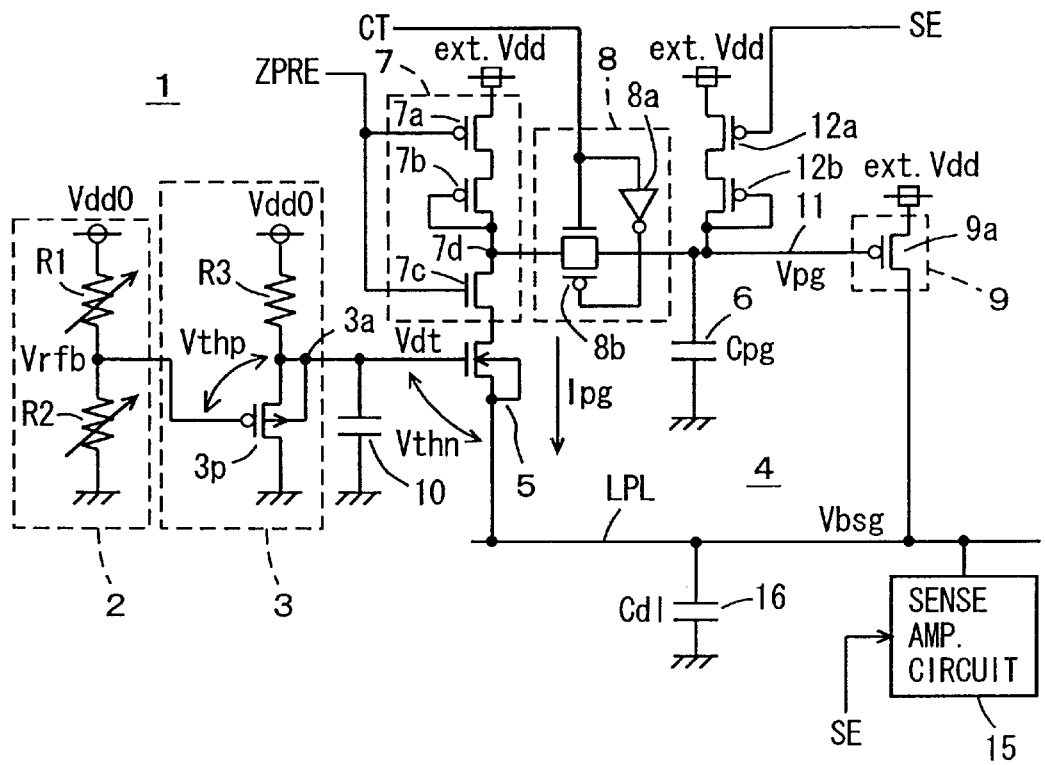
FIGS. 18A and 18B show a structure of an internal voltage generating circuit from which the present invention is derived and a signal waveform diagram illustrating an operation of the internal voltage generating circuit in FIG. 18A, respectively.

Internal voltage generating circuit 1 further includes, similarly to the internal voltage generating circuit shown in FIG. 18A, a difference detection MOS transistor 5 according to control voltage Vdt on internal node 3a and voltage Vbsg on a low level sense supply line LPL to supply a current Ipg to low level sense supply line LPL, a capacitance element 6, a precharge circuit 7 according to a precharge instruction signal ZPRE to supply charges for precharge to capacitance element 6, a charge holding circuit 8 according to a charge transfer instruction signal CT to isolate capacitance element 6 from precharge circuit 7, and a current drive circuit 9 according to a charged voltage Vpg of capacitance element 6 to supply a current from an external supply node to low level sense supply line LPL.

Current drive circuit 9 is formed of a P channel MOS transistor 9a. Between one electrode node 11 of capacitance element 6 and the external supply node, a P channel MOS transistor 12a which is turned on in response to a sense operation activation signal SE, and a diode-connected P channel MOS transistor 12b connected in series to MOS transistor 12a are provided. MOS transistor 5, precharge circuit 7, capacitance element 6, charge holding circuit 8, and current drive circuit 9 constitute a Vbsg generating circuit (voltage compensation circuit: level detection/I-V converting unit) 4. Using voltage Vbsg on low level sense supply line LPL as one operating supply voltage, a sense amplifier circuit 15 performs a sensing operation. A stabilization capacitance 16 is connected to low level sense supply line LPL.

Voltage compensation circuit 4 and current drive circuit 9 operate in the similar manner to the circuits shown in FIG. 18A, and detailed description thereof is not given here.

Reference voltage generating circuit 2 includes variable resistance elements R1 and R2 connected in series between a power supply node 2a and a ground node. On a connection node 2b connecting variable resistance elements R1 and R2, reference voltage Vrfb is generated. Reference voltage Vrfb is set at a voltage level equal to a target value of boosted sense ground voltage Vbsg. In other words, Vrfb is made equal to Vbsg.

Comparison circuit 3A includes a P channel MOS transistor 13a coupled to the external supply node to serve as a current source, P channel MOS transistors 13b and 13c constituting a comparison stage for comparing voltage Vrfb on node 2b with a voltage Vx on a node 13i, and N channel MOS transistors 13d and 13e coupled between respective MOS transistors 13b and 13c and the ground node to constitute a current mirror circuit flowing currents of the same magnitude to MOS transistors 13b and 13c. MOS transistor 13e constitutes the master stage of the current mirror stage. Current source MOS transistor 13a has its gate connected to the ground node to function as a current limiting element to limit an operating current in comparison circuit 3A.

Output circuit 3B includes a P channel MOS transistor 13f connected between the external supply node and node 3a to receive an output signal D0 of comparison circuit 3A at its gate, an N channel MOS transistor 13g connected between nodes 3a and 13i and having its gate connected to node 3a, and a variable resistance element R4 connected between node 13i and the ground node. With the resistance value of variable resistance element R4 set sufficiently high, MOS transistor 13g operates in a diode mode to cause voltage drop corresponding to a threshold voltage Vthn thereof between nodes 3a and 13i.

Comparison circuit 3A adjusts the gate voltage of MOS transistor 13f such that reference voltage Vrfb and voltage Vx on node 13i are equal to each other. Voltage Vx is determined by a current supplied from current drive MOS transistor 13f and the resistance value of variable resistance element R4. Control voltage Vdt from node 3a is thus represented by the following expression.

$$Vdt = Vrfb + Vthn$$

In voltage compensation circuit (level detection/I-V conversion unit) 4, difference detection MOS transistor 5 supplies, according to control voltage Vdt and voltage Vbsg on low level sense supply line LPL, current Ipg to low level sense supply line LPL. Difference detection MOS transistor 5 is turned on when the gate-source voltage exceeds threshold voltage Vthn thereof to supply current Ipg to low level sense supply line LPL. According to current Ipg, charged voltage Vpg of capacitance element 6 is determined. According to voltage Vpg, current drive circuit 9 supplies a current to low level sense supply line LPL. In this way, by an operation similar to that illustrated by the operation waveforms in FIG. 18B, the voltage level of boosted sense ground voltage Vbsg is adjusted.

In voltage compensation circuit (difference detection/I-V conversion unit) 4, charge transfer instruction signal CT is used to isolate capacitance element 6 from difference detection MOS transistor 5 for the following reason.

Figure 18B:
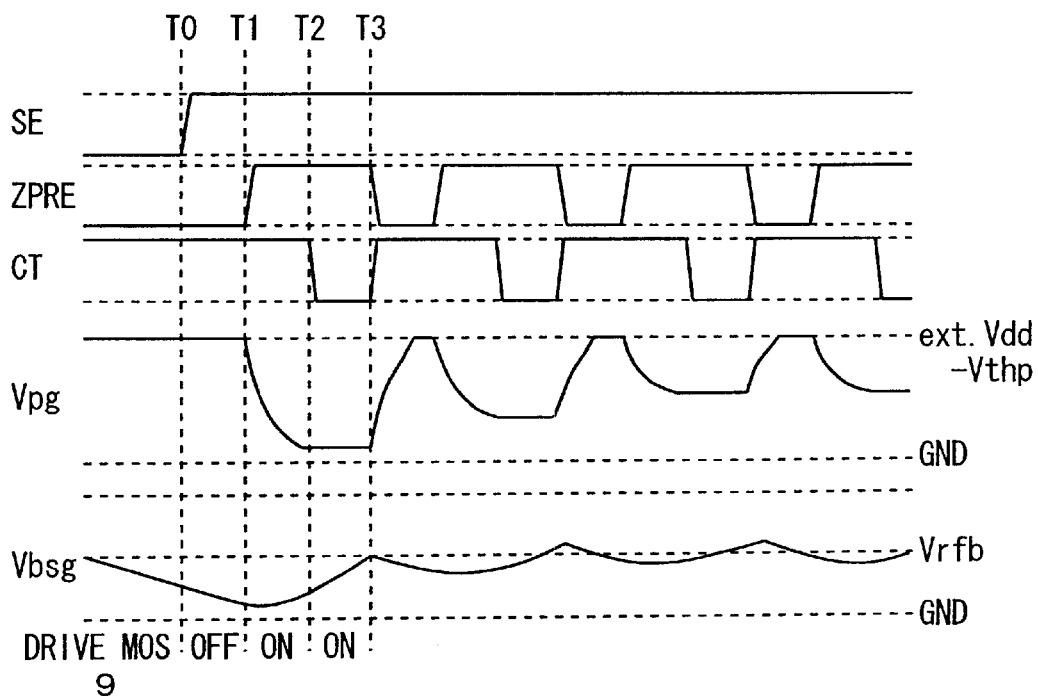

It is supposed here that charge transfer instruction signal CT is kept in the active state of H level. If the voltage level of boosted sense ground voltage Vbsg begins to rise and the voltage level of boosted sense ground voltage Vbsg is still lower than a predetermined value, the voltage level of voltage Vpg on node 11 continues decreasing. Then, the current supplying capability of transistor 9a of current drive circuit 9 is increasingly enhanced to apply a current to low level sense supply line LPL more than necessary, causing overshoot of boosted sense ground voltage Vbsg, and accordingly, boosted sense ground voltage Vbsg exceeds the predetermined voltage level to prevent L level data of a correct voltage level from being stored in a memory cell. In order to avoid such an overshoot, charge transfer instruction signal CT in FIG. 18B is set in the inactive state to hold voltage Vpg on node 11 at a constant voltage level and keep constant the current supplying capability of drive MOS transistor 9a.

The capacitance value of stabilization capacitance 16 attached to low level sense supply line LPL is sufficiently large and voltage compensation circuit 4 operates periodically after being activated, which can provide a shorter drive time (period in which ZPRE=H and CT=L) per cycle. Therefore, the extent of the overshoot can be reduced. If boosted sense ground voltage Vbsg becomes higher than the voltage Vdt−Vthn, MOS transistor 5 is kept in the off state and current Ipg does not flow. In this case, voltage Vpg on node 11 is maintained at the voltage level of the voltage extVdd−Vthp precharged by precharge circuit 7 and current drive MOS transistor 9a is kept in the off state.

In this circuit configuration, boosted sense ground voltage Vbsg is thus maintained at the following voltage level.

$$Vbsg = Vdt - Vthn = Vref + Vthn - Vthn$$
$$= Vrfb.$$

MOS transistors 13g and 5 have the same gate voltages, the same gate sizes (the ratio of the channel length over the channel width) and the same threshold voltages, and have the respective backgates connected to the sources. Therefore, MOS transistors 13g and 5 exhibit the same backgate bias effect and accordingly the respective threshold voltages Vthn are exactly equal to each other. Low level sense supply voltage Vbsg is thus equal to reference voltage Vrfb and temperature characteristics of threshold voltage Vthn do not affect detection of the voltage level of boosted sense ground voltage Vbsg. In this way, the voltage level of boosted sense ground voltage Vbsg can correctly be set at the same level as that of reference voltage Vrfb.

Supply node 2a of reference voltage generating circuit 2 receives a voltage Vdd0 from an internal power supply circuit 20. Internal power supply circuit 20 generates a voltage independent of external supply voltage extVdd and temperature to supply the generated voltage to reference voltage generating circuit 2 as power supply voltage Vdd0. As for internal power supply circuit 20, such a circuit structure may be employed that generates a reference voltage depending on temperature, generates a constant current according to the reference voltage, and converts the constant current into voltage by channel resistance and the threshold voltage. The channel resistance (ON resistance) and the threshold voltage have positive and negative temperature characteristics respectively in a case of a P channel MOS transistor. In internal power supply circuit 20, the channel resistance, the threshold voltage, and the reference voltage for generating voltage Vdd0 are determined in value so as to have their temperature dependency characteristics balanced with each other, to eliminate the dependency of voltage Vdd0 applied to reference voltage generating circuit 2 on external power supply voltage extVdd and temperature.

Reference voltage generating circuit 2 generates reference voltage Vrfb by means of resistance division by variable resistance elements R1 and R2. Reference voltage Vrfb is represented by the following expression.

$$Vrfb = Vdd0 \cdot R2/(R1+R2)$$

Voltage Vdd0 is independent of temperature. With respect to the resistance components, the denominator and numerator include resistance values. Regarding variable resistance elements R1 and R2, if reference resistance elements having the same temperature characteristics are connected in series and resistance values R1 and R2 are set (by selective programming by fuses), the temperature dependency in resistance component of those variable resistance elements can be eliminated. Consequently, the temperature dependency of voltage Vx can be eliminated. (Comparison circuit 3A operates such that reference voltage Vrfb is equal to voltage for comparison Vx.) Accordingly, the temperature dependency of boosted sense ground voltage Vbsg on low level sense supply line LPL can be canceled to set the voltage level of boosted sense ground voltage Vbsg at a constant voltage level over a wide temperature range.

As heretofore described, according to the first embodiment of the invention, in the voltage compensation circuit, gate control voltage Vdt of the difference detection MOS transistor supplying current Ipg for level detection/I-V conversion is generated such that its temperature characteristics are the same as the temperature characteristics exhibited by difference detection MOS transistor 5. The voltage on low level sense supply line LPL can thus be made constant regardless of operating temperature.

In reference voltage generating circuit 2, respective resistance values of variable resistance elements R1 and R2 are made as large as possible. A through current in the reference voltage generating circuit forms a part of a current component in a standby period. Reference voltage Vrfb generated by reference voltage generating circuit 2 is merely applied to the gate of the MOS transistor in the comparison stage of comparison circuit 3A. Therefore, enhancement of the current driving capability of the reference voltage generating circuit is unnecessary. This is because charging of the gate capacitances is just required.

Second Embodiment

Figure 2:
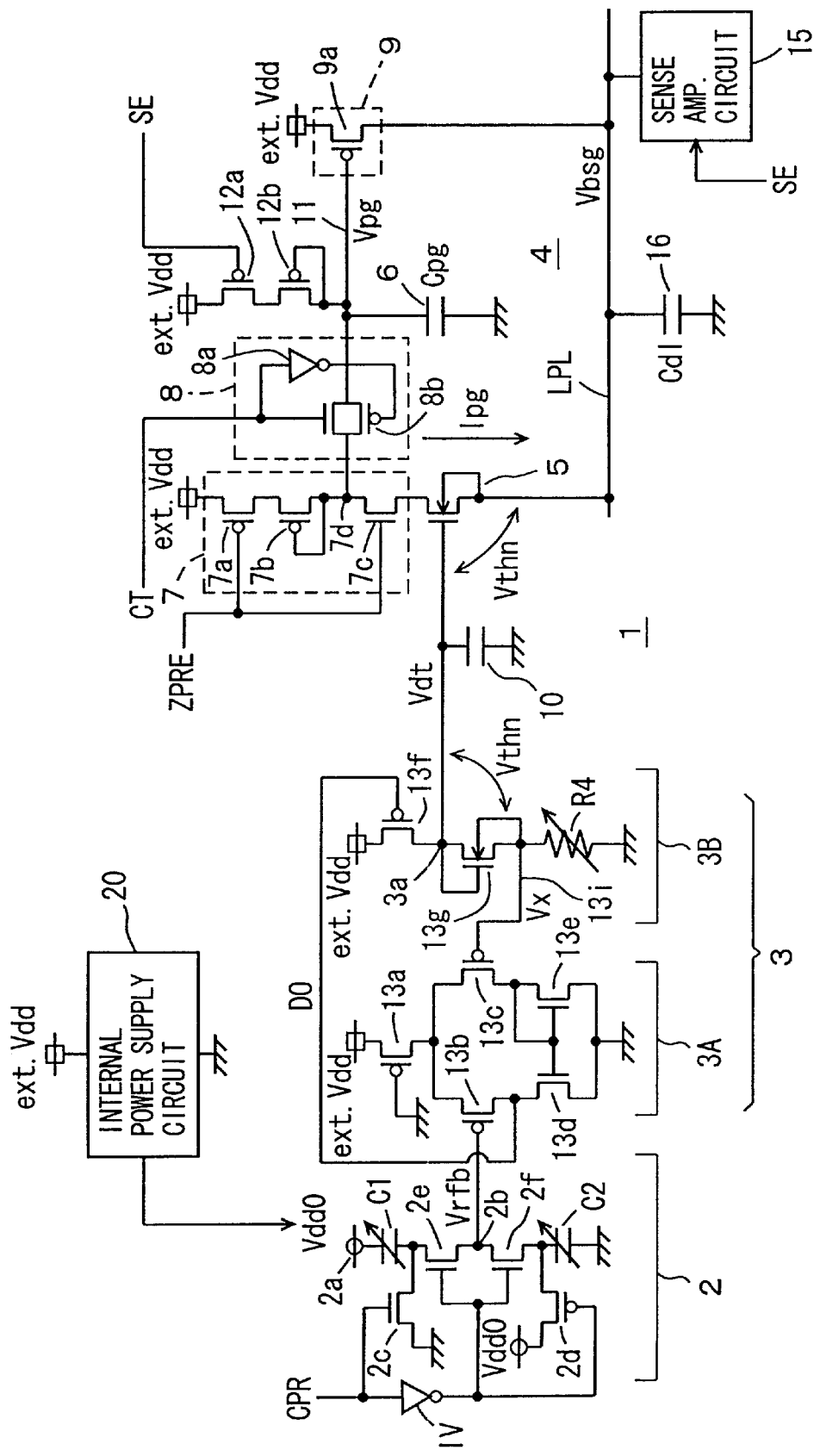
FIG. 2 shows a structure of an internal voltage generating circuit according to a second embodiment of the invention.

FIG. 2 shows a structure of an internal voltage generating circuit 1 according to the second embodiment of the invention. The structure of internal voltage generating circuit 1 shown in FIG. 2 is different from the structure in FIG. 1 in the structure of a reference voltage generating circuit 2. FIG. 2 shows the usage of variable capacitance elements C1 and C2 in reference voltage generating circuit 2. Variable capacitance element C1 has its one electrode node connected to a power supply node 2a, and variable capacitance element C2 has its one electrode node connected to a ground node.

Reference voltage generating circuit 2 further includes an N channel precharging MOS transistor 2c that is turned on when a clock signal CPR is at H level to couple the other electrode node of variable capacitance element C1 to the ground node, a P channel precharging MOS transistor 2d that receives clock signal CPR via an inverter IV to couple the other electrode node of variable capacitance element C2 to the power supply node, and N channel MOS transistors 2e and 2f that are turned on when an output signal of inverter IV is at H level to couple the other electrode nodes of variable capacitance elements C1 and C2 to an output node 2b.

Clock signal CPR is generated by an oscillation circuit such as ring oscillator, and changes at a predetermined period. Other structure components are similar to those shown in FIG. 1, components corresponding to each other have the same reference numerals and detailed description thereof is not repeated here.

When clock signal CPR is at H level, MOS transistors 2c and 2d are turned on, the other electrode node of variable capacitance element C1 is coupled to the ground node, the other electrode node of variable capacitance element C2 is coupled to the power supply node to receive a supply voltage Vdd0. The other electrode nodes of variable capacitance elements C1 and C2 are charged and discharged to a ground voltage and voltage Vdd0, respectively.

When clock signal CPR is at L level, MOS transistors 2c and 2d are turned off and MOS transistors 2e and 2f for equalization are turned on. Responsively, variable capacitance elements C2 and C1 are coupled together and stored charges therein are equalized. This equalize operation generates reference voltage Vrfb on output node 2b. The voltage level of reference voltage Vrfb is determined by the capacitance values of variable capacitance elements C1 and C2 and the voltage level of voltage Vdd0. The level of reference voltage Vrfb is determined in the following manner according to a charge conservation law:

$$C1 \cdot (0-Vdd0)+C2 \cdot Vdd0+C0 \cdot Vrfb' = C1 \cdot (Vrfb-Vdd0)+C2 \cdot Vrfb+ C0 \cdot Vrfb \quad (7).$$

In the expression above, C0 represents an output load associated with output node 2b, and Vrfb' represents a voltage level on output node 2b when clock signal CPR is at H level.

If an output voltage level of reference voltage generating circuit 2 is not affected by leakage and the like, the relation Vrfb'=Vrfb is satisfied and the expression below holds.

$$Vrfb = Vdd0 \cdot C2/(C1+C2) \quad (8).$$

By changing the combination of capacitance values of variable capacitance elements C1 and C2, a reference voltage of any level between the ground voltage and voltage Vdd0 can be generated as reference voltage Vrfb. If variable capacitance elements C1 and C2 are implemented by MOS capacitors, for example, the occupied area by reference voltage generating circuit 2 can drastically be reduced, as compared with a circuit constituted of pure resistance elements such as line resistance. The through current in reference voltage generating circuit 2 is determined by the capacitance values of variable capacitance elements C1 and C2 and the cycle of clock signal CPR. The capacitance values of the variable capacitance elements and the cycle of clock signal CPR are appropriately defined to reduce the through current in reference voltage generating circuit 2 easily.

Modification

Figure 3:
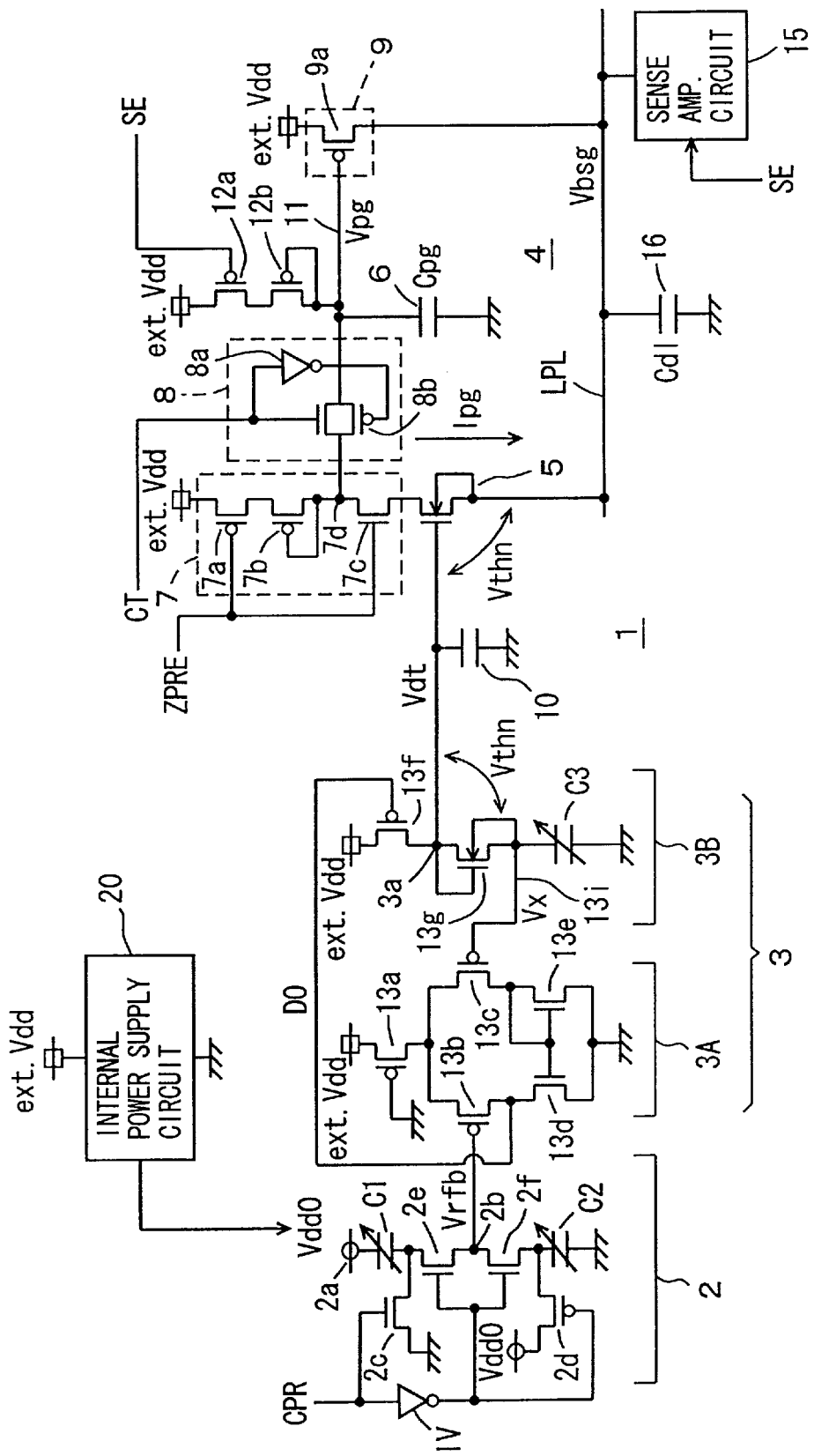
FIG. 3 shows a modification of the second embodiment of the invention.

FIG. 3 shows a structure of a modification of the second embodiment of the invention.

In the structure shown in FIG. 3, the structure of an output circuit 3B is different from that shown in FIG. 2. In output circuit 3B, a variable capacitance element C3 is arranged, instead of variable resistance element R4, between a node 13i and a ground node. Other structures of components are similar to those shown in FIG. 2 and corresponding components are denoted by the same reference numerals.

When variable capacitance element C3 is employed in output circuit 3B as shown in FIG. 3, its charged voltage determines a voltage for comparison Vx to a comparison circuit 3A. If voltage Vx drops below a reference voltage Vrfb due to leakage current and the like, an output signal DO of comparison circuit 3A goes to a low level in an analog manner and accordingly current is supplied from a current drive MOS transistor 13f. Accordingly, variable capacitance element C3 is charged and the voltage level of voltage Vx increases. In this way, a control voltage Vdt can accurately be generated by the charged voltage of variable capacitance element C3.

In output circuit 3B, there is no path through which a through current flows from an external power supply node to the ground node, and therefore, a standby current can be reduced. Compared with the circuit in which variable resistance element R4 is implemented by a line resistance, this circuit has an occupying area reduced by implementing variable capacitance element C3 by a MOS capacitor.

Variable capacitance elements C1–C3 each are formed by providing unit MOS capacitors in parallel with a corresponding node and selectively connecting these unit MOS capacitors by programming fuses. The capacitance values of these variable capacitances can thus be programmed (trimmed). Alternatively, mask interconnection may be used to program them to have appropriate capacitance values.

As discussed above, according to the second embodiment of the invention, in the reference voltage generating circuit and the control voltage output circuit, capacitance elements are used to generate the required voltages. In this way, both of the occupied area and current consumption can be reduced.

Third Embodiment

Figure 4:
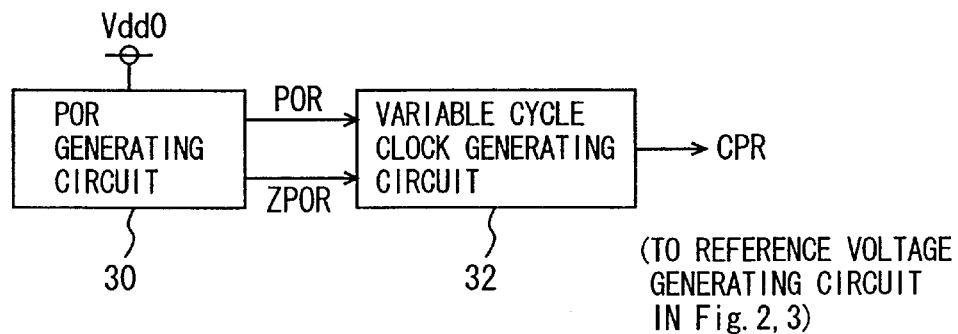
FIG. 4 schematically shows a structure of a clock signal generating portion shown in FIG. 3.

FIG. 4 schematically shows a structure of a portion that generates clock signal CPR according to the third embodiment of the invention. Referring to FIG. 4, the clock signal generating portion includes a POR generating circuit 30 generating power on detection signals POR and ZPOR for stopping an operation of an internal circuit for a predetermined period of time when power supply voltage Vdd0 is started to be applied, and a variable-cycle clock generating circuit 32 generating clock signal CPR of a variable cycle according to power on detection signals POR and ZPOR from POR generating circuit 30. The clock signal CPR is generated at a set cycle after power is on.

When power is on, POR generating circuit 30 maintains power on detection signals POR and ZPOR respectively at L and H levels of the inactive state until the power supply voltage Vdd0 reaches a predetermined voltage level. Variable-cycle clock generating circuit 32 generates clock signal CPR at a shorter cycle during a transition period in which these power on detection signals POR and ZPOR indicate the non-steady state after power is on. Variable-cycle clock generating circuit 32 generates clock signal CPR at a longer cycle when power on detection signals POR and ZPOR are inactivated and the power supply voltage Vdd0 becomes stable. In this way, in reference voltage generating circuit 2 shown in FIG. 2 or FIG. 3, the cycle of the charging/discharging operation of variable capacitance elements C1 and C2 are shortened when power is on, to speedily drive reference voltage Vrfb into the steady state.

Figure 5:
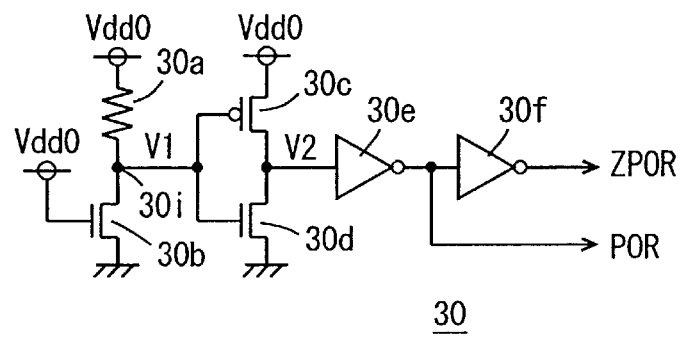
FIG. 5 exemplarily shows a structure of a POR generating circuit shown in FIG. 3.
Figure 6:
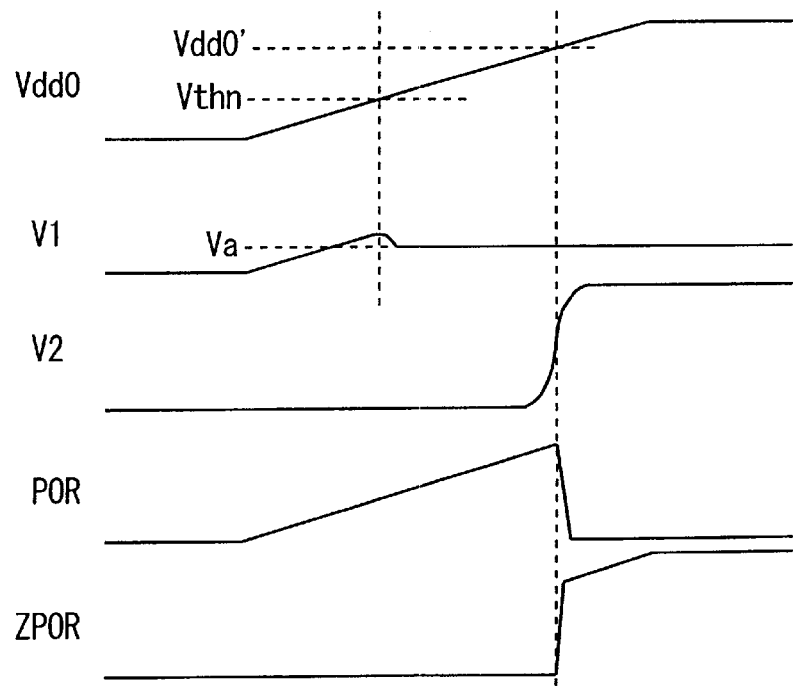
FIG. 6 is a signal waveform diagram illustrating an operation of the POR generating circuit in FIG. 5.

FIG. 5 exemplarily shows a structure of POR generating circuit 30 in FIG. 4. Referring to FIG. 5, POR generating circuit 30 includes a resistance element 30a connected between a power supply node and an internal node 30i, an N channel MOS transistor 30b connected between internal node 30i and a ground node and having its gate connected to the power supply node, a P channel MOS transistor 30c and an N channel MOS transistor 30d connected serially between the power supply node and the ground node and having gates receiving a voltage V1 on internal node 30i to generate a voltage V2, an inverter circuit 30e inverting voltage V2 to generate power on detection signal POR, and an inverter circuit 30f inverting power on detection signal POR from inverter circuit 30e to generate complementary power on detection signal ZPOR. MOS transistor 30b has its gate receiving power supply voltage Vdd0 and detects the voltage level of voltage V1 on node 30i. An operation of POR generating circuit 30 shown in FIG. 5 is now described in conjunction with the signal waveform diagram in FIG. 6.

Power is started to be applied and responsively power supply voltage Vdd0 gradually rises (because of a parasitic capacitance and the like on a power supply line). MOS transistor 30b stays in the off state until power supply voltage Vdd0 increases to reach a threshold voltage Vthn of MOS transistor 30b. Voltage V1 on node 30i increases according to a current from resistance element 30a. When supply voltage Vdd0 exceeds threshold voltage Vthn, MOS transistor 30b is turned on and the level of voltage V1 attains a voltage level Va obtained by the voltage-division of voltage Vdd0 by resistance element 30a and an ON resistance of MOS transistor 30b.

An inverter constituted of MOS transistors 30c and 30d has its logical threshold Vthi increased with increase of supply voltage Vdd0. In the period during which supply voltage Vdd0 is low, the relation Vthi<Va is satisfied and voltage V2 is at L level. When supply voltage Vdd0 rises to satisfy the relation Vthi>Va (Vdd0=Vdd0'), the logical level of voltage V2 changes to H level. In other words, at this time, it is determined that supply voltage Vdd0 is sufficiently high. In response to this change, inverter circuit 30e drives power on detection signal POR to L level and accordingly inverter 30f drives complementary power on detection signal ZPOR to H level.

After power is on, until supply voltage Vdd0 has a stable voltage level, power on detection signal POR and ZPOR are set respectively at H level and L level to prevent the internal circuitry from operating in an unstable manner. By adjustment of the current driving capability of MOS transistor 30c, the H level period of power on detection signal POR can be set appropriately.

Variable-cycle clock generating circuit 32 changes the oscillation cycle thereof according to power on detection signals POR and ZPOR.

Figure 7:
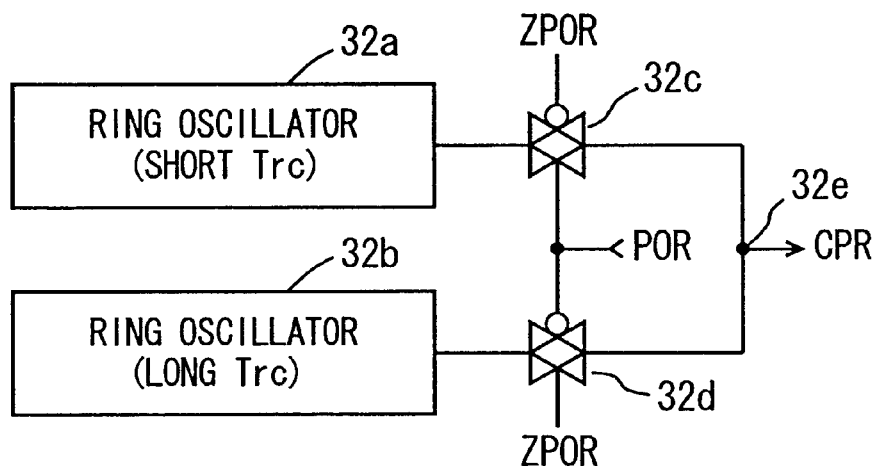
FIG. 7 schematically shows a structure of a variable period clock generating circuit in FIG. 4.

FIG. 7 schematically shows a structure of variable-cycle clock generating circuit 32 shown in FIG. 4. Referring to FIG. 7, variable-cycle clock generating circuit 32 includes a ring oscillator 32a having a short cycle Trc, a ring oscillator 32b having a long cycle Trc, a transmission gate 32c selecting a signal generated by ring oscillator 32a when power on detection signals POR and ZPOR are activated, and a transmission gate 32d selecting an output signal of ring oscillator 32b when power on detection signals POR and ZPOR are inactivated. Transmission gates 32c and 32d transmit the selected signals to an output node 32e. From this output node 32e, clock signal CPR is generated. An operation of variable-cycle clock generating circuit 32 in FIG. 7 is now described with reference to the signal waveform diagram shown in FIG. 8.

Power is switched in and responsively the level of supply voltage Vdd0 increases according to the external power supply voltage. Until supply voltage Vdd0 is stabilized, power on detection signal POR is at H level and complementary power on detection signal ZPOR is at L level. Transmission gate 32c is conductive while transmission gate 32d is non-conductive, and an output signal of ring oscillator 32a is selected as clock signal CPR. According to this clock signal CPR, in reference voltage generating circuit 2 shown in FIG. 3, the variable capacitance elements are charged/discharged to generate reference voltage Vrfb. Ring oscillator 32a generates the clock signal with a cycle Trca and the clock signal is of relatively high rate. Reference voltage Vrfb thus rises to its predetermined value relatively speedily.

When supply voltage Vdd0 becomes stable, power on detection signal POR falls to L level and complementary power on detection signal ZPOR rises to H level. Responsively, transmission gate 32d becomes conductive while transmission gate 32c becomes non-conductive, and an output signal of ring oscillator 32b is selected as clock signal CPR to be supplied to reference voltage generating circuit 2 shown in FIG. 2 or 3. The cycle Trc of ring oscillator 32b is a relatively long cycle Trcb. After reference voltage Vrfb reaches the steady state, charges are supplied to the output node at the long cycle Trcb to compensate for drop of reference voltage Vrfb due to leakage current. In this way, after power is on, in the period of a specification value which is set, for example, at 500 μs, reference voltage Vrfb can attain the steady state.

As an operating power supply voltage for ring oscillators 32a and 32b, supply voltage Vdd0 may be used. Alternatively, external supply voltage extVdd may be used that becomes stable most speedily. The amplitude of clock signal CPR does not affect the amount of charges stored in variable capacitance elements C1 and C2 in reference voltage generating circuit 2 shown in FIG. 3. Therefore, any supply voltage may be used.

Modification

Figure 9:
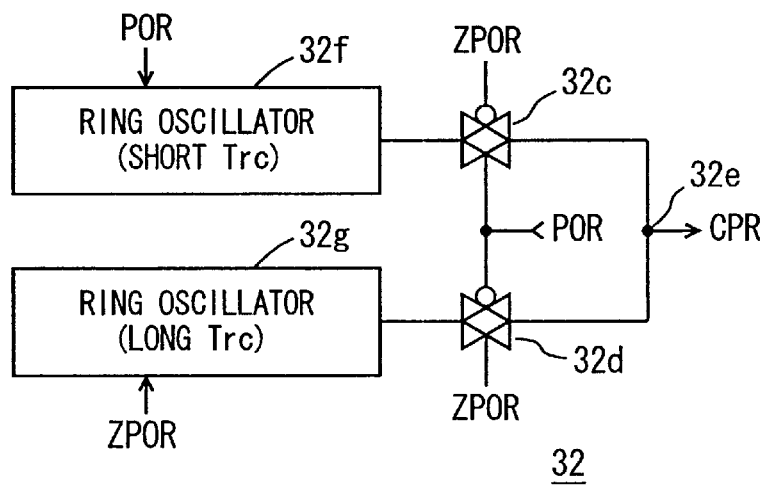
FIG. 9 shows a modification of the variable period clock generating circuit in FIG. 4.

FIG. 9 shows a structure of a modification of the third embodiment of the invention. Referring to FIG. 9, a variable cycle clock generating circuit 32 includes a ring oscillator 32f of a short cycle and a ring oscillator 32g of a long cycle. Ring oscillator 32f performs an oscillating operation when power on detection signal POR is at H level. Ring oscillator 32g is activated, when complementary power on detection signal ZPOR is at H level, to perform an oscillating operation. The output signals of ring oscillators 32f and 32g are selected by transmission gates 32c and 32d in a similar manner to that in the structure shown in FIG. 7, to generate a clock signal CPR.

Figure 10:
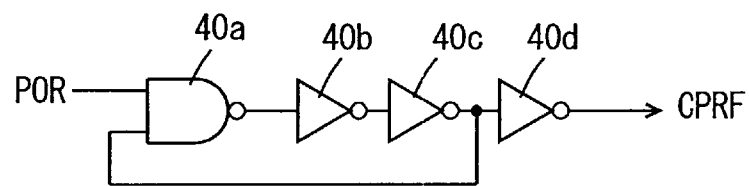
FIG. 10 exemplarily shows a structure of a ring oscillator in FIG. 9.

FIG. 10 exemplarily shows a structure of ring oscillator 32f shown in FIG. 9. Referring to FIG. 10, ring oscillator 32f includes cascaded inverters 40b14 40d, and a NAND circuit 40a receiving power on detection signal POR and an output signal of inverter 40c to supply its output signal to inverter 40b. An output signal CPRF of ring oscillator 32f is generated from inverter 40d.

In the structure of ring oscillator 32f shown in FIG. 10, when power on detection signal POR is at H level, NAND circuit 40a operates as an inverter, and NAND circuit 40a and inverters 40b and 40c form a ring oscillator. Inverter 40d outputs oscillation signal CPRF. When power on detection signal POR is at L level, an output signal of NAND circuit 40a is fixed at H level and accordingly oscillation signal CPRF from inverter 40d is fixed at L level. When power on detection signal POR is at L level, the oscillating operation of ring oscillator 32f is stopped to allow reduction of current consumption by the amount of this circuit contribution.

Ring oscillator 32g also has the structure similar to that of ring oscillator 32f in FIG. 10. Instead of power on detection signal POR, complementary power on detection signal ZPOR is used. The number of inverter stages is increased to lengthen the oscillation cycle.

In ring oscillator 32f shown in FIG. 10, the ring oscillator is constituted equivalently of inverters of three stages. However, the ring oscillator is merely required to be constituted of an odd number of inverters when the oscillator is activated, and the number of cascaded inverters 40b and 40c may be 2 or more.

Figure 8:
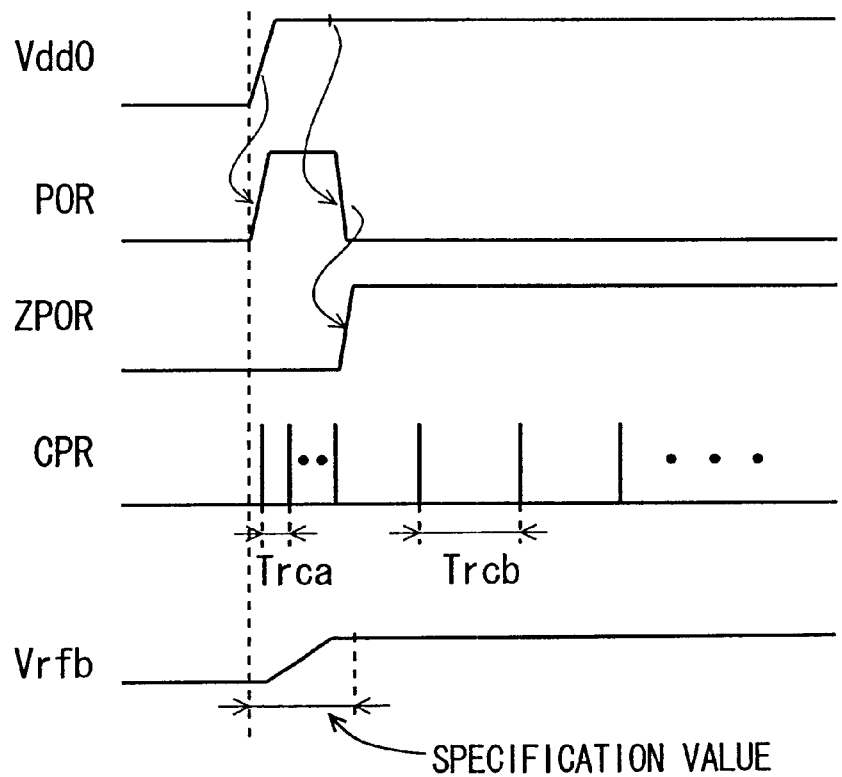
FIG. 8 is a signal waveform diagram illustrating an operation of the circuit in FIG. 7.

Inverter 40d of the output stage may be constituted of a tristate inverter which is in an output high impedance state when power on detection signal POR is at L level. If inverter 40d is constituted of the tristate inverter buffer, transmission gates 32c and 32d shown in FIG. 8 are unnecessary and accordingly the occupying area of the circuit is reduced.

This circuit may be structured in the following way. Specifically, the change of the oscillation cycle of the ring oscillator may be done not only when power is on, but also when a transition from the non-steady state to the steady state occurs, for example, when the system is reset. In this case, in the transition from the non-steady state to the steady state, a state transition detection signal is used to change the oscillation cycle of the ring oscillator. Instead of the power on detection signal, the state transition detection signal such as a system reset signal is used, for example.

As heretofore described, according to the third embodiment of the invention, in the transition from the non-steady state to the steady state such as the time of power on, change is made of the cycle of the clock signal for controlling charging/discharging of the capacitance elements of the reference voltage generating circuit. In this way, in the transition to the steady state, the reference voltage can be made stable speedily and thus the timing of starting an internal operation can be made advanced.

Fourth Embodiment

Figure 11:
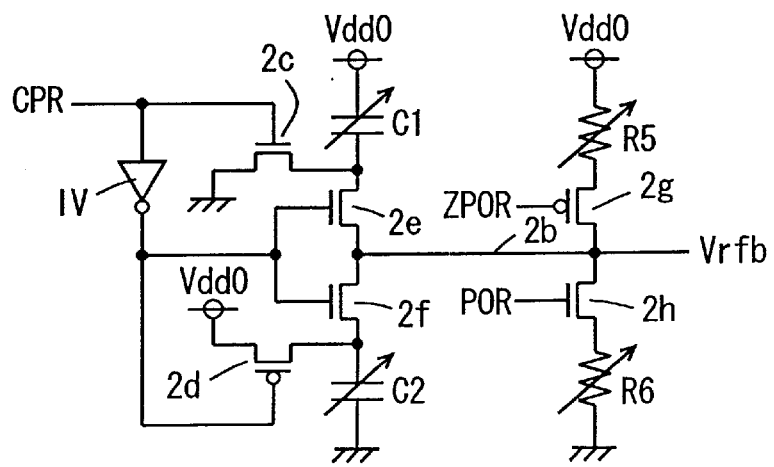
FIG. 11 shows a structure of a main part of an internal voltage generating circuit according to a fourth embodiment of the invention.

FIG. 11 shows a structure of a reference voltage generating circuit 2 according to the fourth embodiment of the invention. In reference voltage generating circuit 2 shown in FIG. 11, in addition to the structure of reference voltage generating circuit 2 shown in FIG. 3, a variable resistance element R5 and a P channel MOS transistor 2g receiving, at its gate, complementary power on detection signal ZPOR are provided to be connected in series between a power supply node receiving power supply voltage Vdd0 and an output node 2b. Further, between output node 2b and a ground node, an N channel MOS transistor 2h receiving, at its gate, power on detection signal POR and a variable resistance element R6 are provided to be connected in series to each other.

In the structure shown in FIG. 11, after power is on and until supply voltage Vdd0 becomes stable, power on detection signals POR and ZPOR are at H and L levels, respectively, and variable resistance elements R5 and R6 are coupled to output node 2b. Accordingly, a voltage generated on output node 2b is determined by variable resistance elements R5 and R6 and a channel resistance of MOS transistors 2g and 2h. The resistance values of variable resistance elements R5 and R6 can be set relatively smaller to speedily perform charging operation to output node 2b.

Reference voltage Vrfb can be driven into the stable state at a high speed and the occupied area by variable resistance elements R5 and R6 can be reduced.

When power on detection signal POR is at L level and complementary power on detection signal ZPOR is H level, MOS transistors 2g and 2h are turned off. Accordingly, variable resistance elements R5 and R6 are isolated from output node 2b and the path through which a through current flows in an auxiliary circuit at an output stage of reference voltage generating circuit 2 is cut off.

As variable resistance elements R5 and R6, the channel resistance of MOS transistors may be used.

As discussed above, according to the fourth embodiment of the invention, in the structure in which the capacitance elements are used to generate the reference voltage, in the transition from the non-steady state to the steady state after power is on, for example, the reference voltage is generated by using the resistance elements subsidiarily. Even when this state transition occurs, the reference voltage can be stabilized speedily. In the steady state, this subsidiary resistance elements are isolated from the output node and the reference voltage level is maintained by the capacitance elements only. Consequently there is no path through which the through current constantly flows from the supply node to the ground node in the steady state and thus current consumption can be reduced.

Fifth Embodiment

Figure 12:
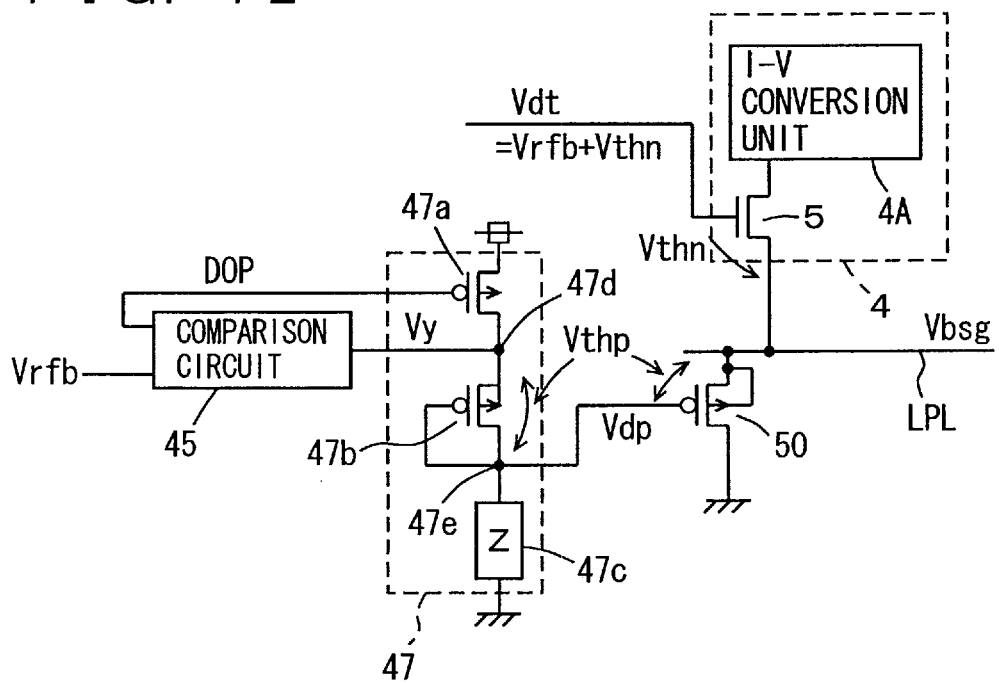
FIG. 12 shows a structure of a main part of an internal voltage generating circuit according to a fifth embodiment of the invention.

FIG. 12 shows a structure of an internal voltage generating circuit according to the fifth embodiment of the invention. The internal voltage generating circuit shown in FIG. 12 has a structure for preventing, when a boosted sense ground voltage Vbsg on a low level sense supply line LPL becomes higher than a predetermined voltage level, this rise-up of voltage. Referring to FIG. 12, the internal voltage generating circuit includes a comparison circuit 45 comparing a reference voltage Vrfb with a voltage Vy on a node 47d, an output circuit 47 according to a signal DOP from comparison circuit 45 which indicates a result of the comparison to adjust the level of voltage Vy and generate a control voltage Vdp, and a P channel MOS transistor 50 coupled between low level sense supply line LPL and a ground node and having a gate receiving control voltage Vdp from output circuit 47. MOS transistor 50 and a MOS transistor 47b have the same size (the ratio of the channel width to the channel length), and have the same backgate bias effect.

Low level sense supply line LPL is provided with a structure for preventing decrease of boosted sense ground voltage Vbsg, although not explicitly shown in FIG. 12. As a structure for preventing this voltage drop, any of the first to the fourth embodiments may be used. FIG. 12 shows a structure of a difference detection/I-V conversion unit (voltage compensation circuit) 4. Difference detection/I-V conversion unit 4 includes an I-V conversion unit 4A including a capacitance element and a current drive circuit, and a drive MOS transistor 5 according to a control voltage Vdt to supply current to low level sense supply line LPL. Any of the first to the fourth embodiments may be employed for the portion for generating control voltage Vdt.

Reference voltage Vrfb is generated by the reference voltage generating circuits according to any of the first to the fourth embodiments.

Output circuit 47 includes a P channel MOS transistor 47a connected between an external supply node and a node 47d to supply current to node 47d according to output signal DOP of comparison circuit 45, P channel MOS transistor 47b connected between node 47d and a node 47e and having its gate connected to node 47e, and a variable impedance element 47c connected between node 47e and the ground node. MOS transistor 47b operates in the diode mode to cause a voltage drop corresponding to an absolute value Vthp of a threshold voltage thereof between nodes 47d and 47e. Variable impedance element 47c may be a variable resistance element or a variable capacitance element.

Reference voltage Vrfb is set at a voltage level equal to a target value of boosted sense ground voltage Vbsg on low level sense supply line LPL as done in the first to the fourth embodiments described above. Comparison circuit 45 compares reference voltage Vrfb with voltage Vy on node 47d to adjust the conductance of MOS transistor 47a through the output signal DOP. Voltage Vy on node 47d is kept at the voltage level equal to reference voltage Vrfb by comparison circuit 45 and MOS transistor 47a. MOS transistor 47b causes voltage drop of Vthp. Accordingly, control voltage Vdp from node 47e is represented by: Vrfb−Vthp.

MOS transistor 50 is turned on when the absolute value of its gate-source voltage becomes equal to or higher than absolute value Vthp of the threshold voltage thereof to discharge charges on low level sense supply line LPL. Therefore, MOS transistor 50 is turned on when voltage Vbsg is equal to or higher than Vdp+Vthp. When voltage Vbsg is increased, MOS transistor 50 prevents that increase to adjust the voltage to satisfy the relation of Vbsg=Vrfb.

Drive MOS transistors 5 and 50 can accurately set voltage Vbsg on low level sense supply line LPL at the level of reference voltage Vrfb. MOS transistors 47b and 50 have the same threshold voltage. In the control operation on the voltage Vbsg, threshold voltage Vthp does not affect the voltage level of voltage Vbsg on low level sense supply line LPL. Therefore, when output circuit 47 and drive transistor 50 perform the adjustment operation, the temperature characteristics thereof never affect voltage Vbsg. In this way, boosted sense ground voltage Vbsg can be kept at a constant voltage level over a wide range.

If boosted sense ground voltage Vbsg is 0.4–0.5 V, for example, the absolute value of threshold voltage, Vthp, should be made smaller accordingly (since Vy−Vthp=Vdp should be set equal to or higher than the ground voltage level). However, a negative voltage node may be employed instead of the ground node in output circuit 47, if a negative voltage generating circuit is provided or available.

Comparison circuit 40 and output circuit 47 are merely required to drive the gate capacitance of drive MOS transistor 50 by means of control voltage Vdp. Similarly to the first embodiment, the current driving capability of these circuits can be made small and accordingly the circuit occupation area and current consumption thereof can be reduced. Further, if a variable capacitance element is employed as variable impedance element 47c, through current in output circuit 47 can be prevented and thus current consumption can be further reduced.

Modification

Figure 13:
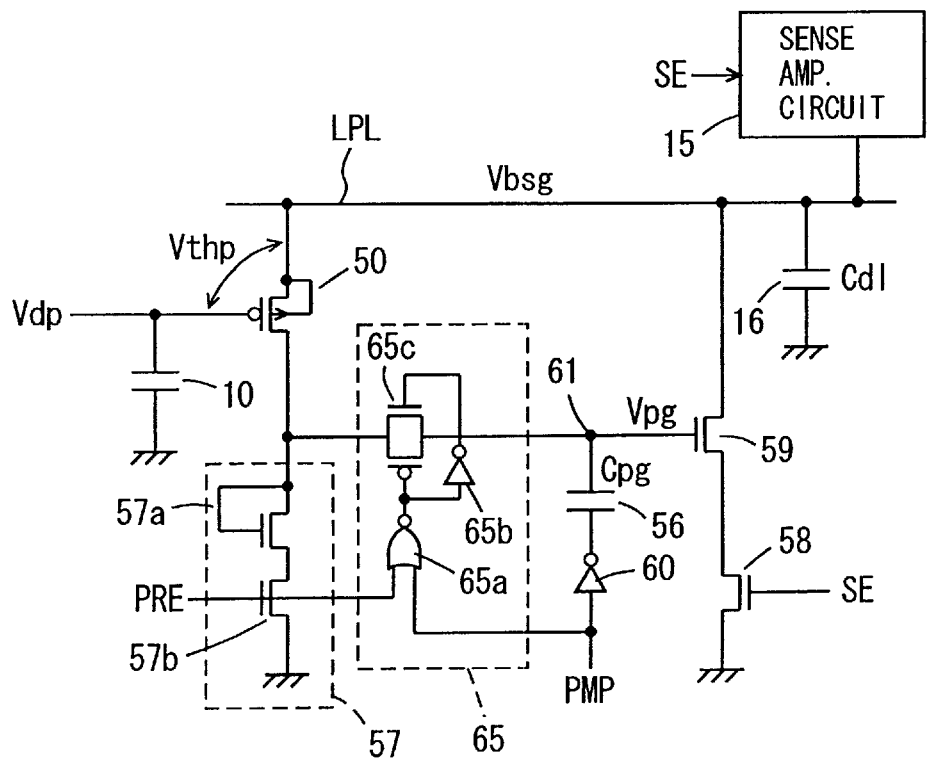
FIG. 13 shows a modification of the fifth embodiment of the invention.

FIG. 13 shows a modification of the fifth embodiment of the invention. A voltage compensation circuit for preventing the rise of voltage Vbsg on low level sense supply line LPL detects the voltage level of boosted sense ground voltage Vbsg via a MOS transistor 50 to adjust the voltage level of voltage Vbsg according to a result of the detection. As a circuit for generating a control voltage Vdp, the structure shown in FIG. 12 can be employed.

Referring to FIG. 13, the voltage compensation circuit includes a P channel MOS transistor 50 for detecting a voltage difference to supply current to a node 61 according to a difference between control voltage Vdp from an output circuit 47 as shown in FIG. 12 and voltage Vbsg on low level sense supply line LPL, a precharge circuit 57 responsive to a precharge instruction signal PRE to precharge a node 61 to a predetermined voltage, a capacitance element 56 having one electrode node connected to node 61 and the other supply node receiving a pump signal PMP via an inverter 60, a charge holding circuit 65 according to precharge instruction signal PRE and pump signal PMP to hold charges on node 61, a drive N channel MOS transistor 59 according to a charged voltage Vpg on node 61 to draw current from low level sense supply line LPL, and an N channel MOS transistor 58 turned on in response to activation of a sense operation activation signal SE to a sense amplifier circuit 15 to form a current path between MOS transistor 59 and a ground node. A stabilization capacitance 16 is connected to low level sense supply line LPL and a stabilization capacitance 10 is connected to the gate of drive MOS transistor 50.

Precharge circuit 57 includes N channel MOS transistors 57a and 57b connected in series between node 61 and the ground node. MOS transistor 57a has its gate and drain connected to each other. MOS transistor 57a operates in a diode mode when turned on, to cause voltage drop corresponding to threshold voltage Vthn thereof. MOS transistor 57b has a gate receiving precharge instruction signal PRE.

Charge holding circuit 65 includes an NOR circuit 65a receiving precharge instruction signal PRE and pump signal PMP, an inverter 65b inverting an output signal of NOR circuit 65a, and a transmission gate 65c selectively turned on in response to output signals of NOR circuit 65a and inverter 65b to form a path for charging and discharging of node 61. Transmission gate 65c becomes non-conductive when signals PRE and PMP are both at L level to hold charges stored on node 61.

Figure 14:
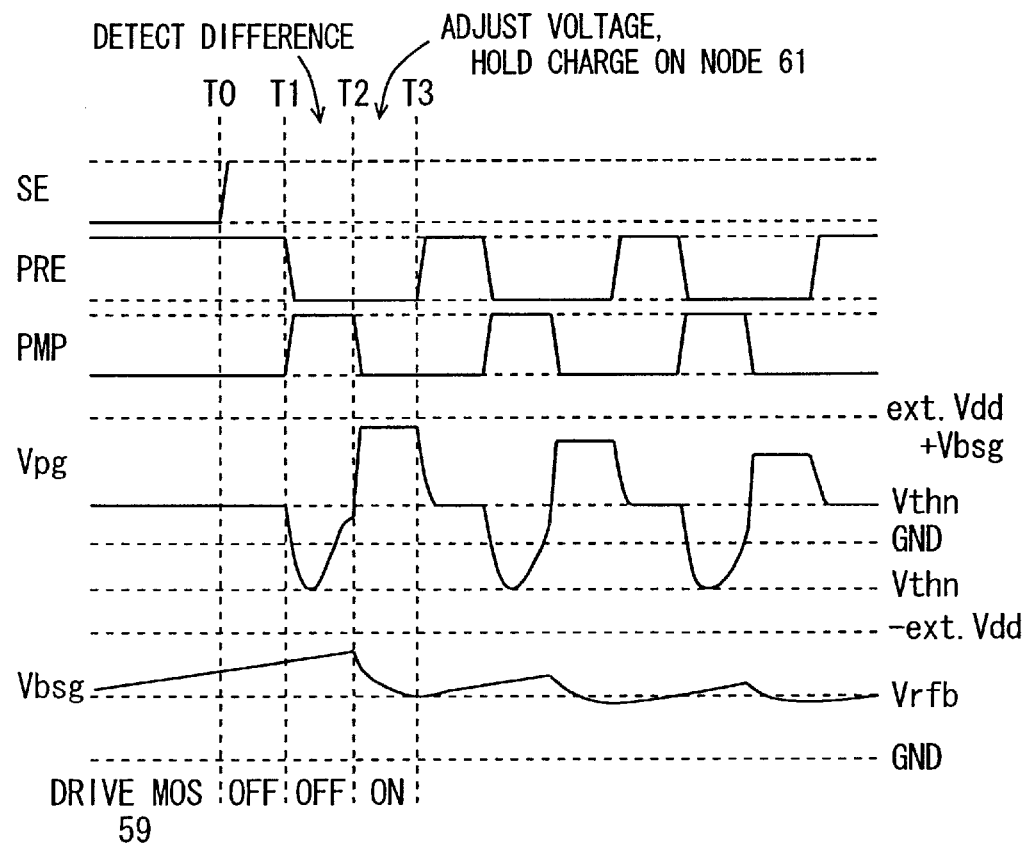
FIG. 14 is a signal waveform diagram illustrating an operation of an internal voltage generating circuit in FIG. 13.

Pump signal PMP has the amplitude of external supply voltage extVdd. Inverter 60 receives external supply voltage extVdd as one operating supply voltage. An operation of the circuit shown in FIG. 13 is now described with reference to the signal waveform diagram shown in FIG. 14.

It is supposed that, when sense amplifier circuit 15 is in a standby state, the voltage Vbsg on low level sense supply line LPL has its level increased by leakage current from a power supply node, for example. Because of the standby state of sense amplifier circuit 15, sense operation activation signal SE is inactive, precharge instruction signal PRE is in the active state of H level and pump signal PMP is fixed at L level. In this state, transmission gate 65c of charge holding circuit 65 is conductive, internal node 61 is discharged by precharge circuit 57, and voltage Vpg on internal node 61 is maintained at the voltage level of threshold voltage Vthn of MOS transistor 57a. Even if the level of boosted sense ground voltage Vbsg increases and current flows via MOS transistor 50, the current from MOS transistor 50 is discharged via precharge circuit 57 since precharge instruction signal PRE is at H level. MOS transistor 50 has its current supply capability sufficiently higher than the current drive capability of precharge circuit 57. The current drive capabilities of MOS transistor 50 and precharge circuit 57 are sufficiently lower than the current drive capability of drive MOS transistor 59 and the rise of boosted voltage Vbsg cannot be prevented.

When boosted sense ground voltage Vbsg is higher than a predetermined voltage level, sense operation activation signal SE is activated at time T0 and accordingly sense amplifier circuit 15 operates. In the period from time T0 to time T1, precharge instruction signal PRE is at H level, pump signal PMP is at L level, the precharge state is maintained, and thus voltage Vbsg continuously rises.

Control voltage Vdp is equal to Vrfb−Vthp. Therefor, when voltage Vbsg becomes higher than reference voltage Vrfb, MOS transistor 50 is turned on, and the current from the low level sense supply line LPL is discharged by precharge circuit 57.

At time T1, precharge instruction signal PRE is driven into the inactive state of L level. Accordingly, pump signal PMP rises to the level of external supply voltage extVdd. In response to the rise of pump signal PMP, an output signal of inverter 60 falls to the ground voltage level. Capacitive coupling (charge pump operation) of capacitance element 61 causes drop of voltage Vpg on node 61 (In precharge circuit 57, MOS transistor 57b is in off state). Specifically, voltage Vpg on node 61 changes from precharge voltage Vthn in the negative direction by the amplitude of pump signal PMP. In other words, because of the rise of pump signal PMP, voltage Vpg on node 61 temporarily decreases to the voltage level of Vthn−extVdd. When the voltage level on node 61 falls to the negative voltage level, current from MOS transistor 50 charges capacitance element 56 to increase the voltage level of charging voltage Vpg because transmission gate 65c is in the conductive state.

At time T2, pump signal PMP falls to L level, and the output signal of inverter 60 rises to the level of external supply voltage extVdd. Accordingly, the charge pump operation of capacitance element 56 causes voltage Vpg on node 61 to rise by the level of external supply voltage extVdd. The level of voltage Vpg at this time is determined according to the amount of charges stored in the period between time T1 and time T2. If the difference between voltage Vbsg and reference voltage Vrfb is large, the amount of charges supplied from MOS transistor 50 to capacitance element 56 is great. Accordingly, the level of voltage Vpg further rises. The voltage level which voltage Vpg on node 61 reaches after falling of pump signal PMP is determined according to the difference between voltage Vbsg and voltage Vrfb. When pump signal PMP is at L level, an output signal of NOR circuit 65a in charge holding circuit 65 becomes H level, transmission gate 65c becomes non-conductive, charges stored on node 61 are maintained, and voltage Vpg on node 61 keeps its voltage level at this time instant.

Drive MOS transistor 59 discharges current from low level sense supply line LPL to the ground node according to voltage Vpg on node 61 when voltage Vpg on node 61 becomes greater than its threshold voltage Vthn. Accordingly, the voltage level of voltage Vbsg is decreased at high speed. In this period, precharge instruction signal PRE is in the inactive state of L level. When current drive MOS transistor 59 performs the discharging operation, both of precharge instruction signal PRE and pump signal PMP are at L level, transmission gate 65 and precharge circuit 57 are non-conductive.

Even if difference detection MOS transistor 50 discharges current from low level sense supply line LPL, the internal node is immediately charged and accordingly difference detection MOS transistor 50 is kept in the off state. Accordingly, discharging by drive MOS transistor 59 causes a sharp drop of voltage Vbsg on low level sense supply line LPL. Voltage Vpg on node 61 is kept at a constant voltage level by charge holding circuit 65 in this discharging period, specifically, the period from time T2 to time T3. The amount of charges Qpg flowing into capacitance element 56 and voltage Vpg satisfy the relation represented by the following expression.

$$Vpg = Vthn - extVdd + Qpg/Cpg \qquad (9)$$

When this voltage difference detecting operation is carried out, drive MOS transistor 59 is turned off and thus no channel is formed therein. Therefore, the gate capacitance of drive MOS transistor can be ignored and thus the gate capacitance Cg thereof is not included expression (9) above.

As clearly seen from expression (9), reduction of capacitance value Cpg of capacitance element 56 causes a great change of the level of voltage Vpg according to a slight change of the charge amount Qpg. The slight change of voltage Vbsg can be amplified to the great change of charged voltage Vpg of capacitance element 56, as done by difference detection/I-V conversion unit 4 in the internal voltage generating circuit according to the first embodiment.

If voltage Vbsg is lower than reference voltage Vrfb, no current flows through MOS transistor 50. In this state, voltage Vpg maintains the voltage Vpg=Vthn−extVdd owing to pump signal PMP. This is determined by Qpg=0. In the period from time T2 to time T3, in response to the fall of pump signal PMP, the output signal of inverter 60 rises and accordingly capacitance element 56 performs the charge pump operation to raise a voltage on node 61. If voltage Vbsg is higher than reference voltage Vrfb, the voltage level on node 61 increases by the level of external supply voltage extVdd. Thus, voltage Vpg has the level represented by the following expression.

$$Vpg=Vthn+Qpg/Cpg \quad (10)$$

This voltage level is higher than threshold voltage Vthn of MOS transistor 59, and MOS transistor 59 is responsively turned on to lower voltage Vbsg through its discharging operation. MOS transistor 59 has a sufficiently high current driving capability and thus the level of voltage Vbsg speedily falls.

Voltage Vpg could rise up to the level of extVdd+Vbsg at maximum. The maximum voltage level is higher than the level of external supply voltage extVdd. Therefore, the current driving capability of MOS transistor 59 is greatly enhanced and accordingly voltage Vbsg is decreased at higher speed.

In the period from time T2 to time T3, if voltage Vbsg is lower than reference voltage Vrfb, voltage Vpg on node 61 just returns to the level of original precharge voltage Vthn. Drive MOS transistor 59 stays in the off state.

At time T3, precharge instruction signal PRE rises to H level and accordingly transmission gate 65c of charge holding circuit 65 becomes conductive, and the activated precharge circuit 57 causes voltage Vpg on node 61 to be lowered forcefully to the level of voltage Vthn. According to the operation, drive MOS transistor 59 is prevented from discharging low level sense ground line LPL with a great current drive capability for a long period of time to cause an undershoot in voltage Vbsg.

The amplitudes of signals PRE and SE should be set equal to the level of external supply voltage extVdd. This is because voltage Vpg on node 61 could become higher than external supply voltage extVdd and voltage Vpg on node 61 should be discharged in precharge circuit 57. However, the amplitudes of the signals PRE and SE may be the level of supply voltage Vdd0.

Pump signal PMP is generated in the form of one shot pulse in response to fall of precharge instruction signal PRE. This circuit structure can be realized easily. Regarding precharge instruction signal PRE and pump signal PMP, when sense operation activation signal SE is activated, precharge instruction signal PRE may be delayed by a predetermined time to generate pump signal PMP. The pulse width of the precharge instruction signal is made equal to the delay time of the pump signal.

As discussed above, according to the fifth embodiment of the invention, when boosted sense ground voltage Vbsg rises slightly, this raised voltage level is decreased according to the difference between control voltage Vdp and boosted sense ground voltage Vbsg. Further, when the voltage level is adjusted, influence of temperature characteristics of operation parameters of difference detection MOS transistor on the detected voltage level is prevented. In this way, voltage Vbsg can be precisely set at a predetermined voltage level over a wide range of temperature.

Sixth Embodiment

Figure 15:
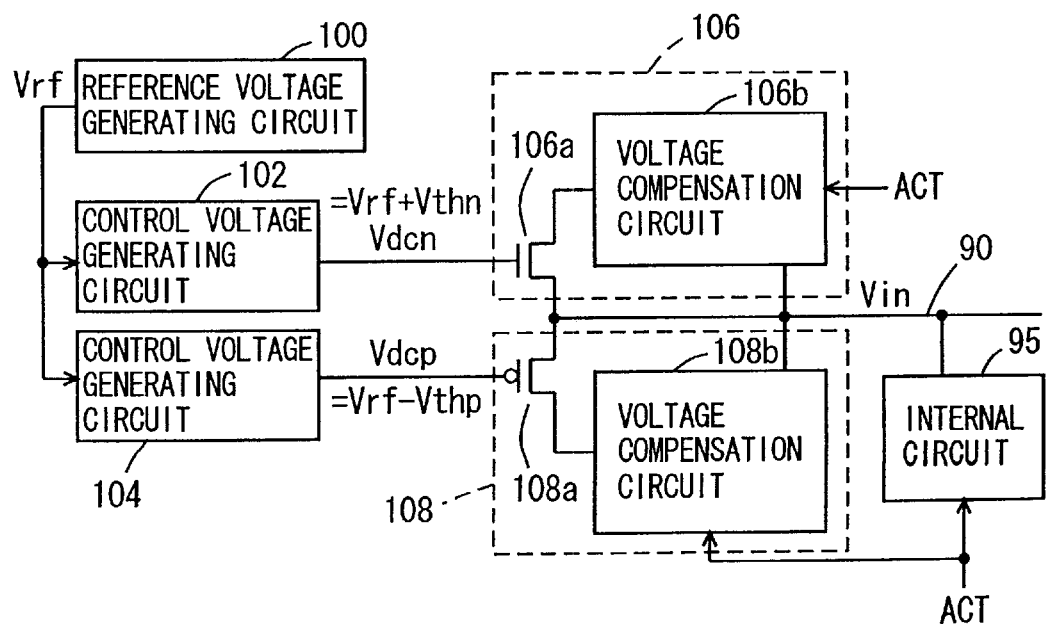
FIG. 15 schematically shows a structure of an internal voltage generating circuit according to a sixth embodiment of the invention.
Figure 16:
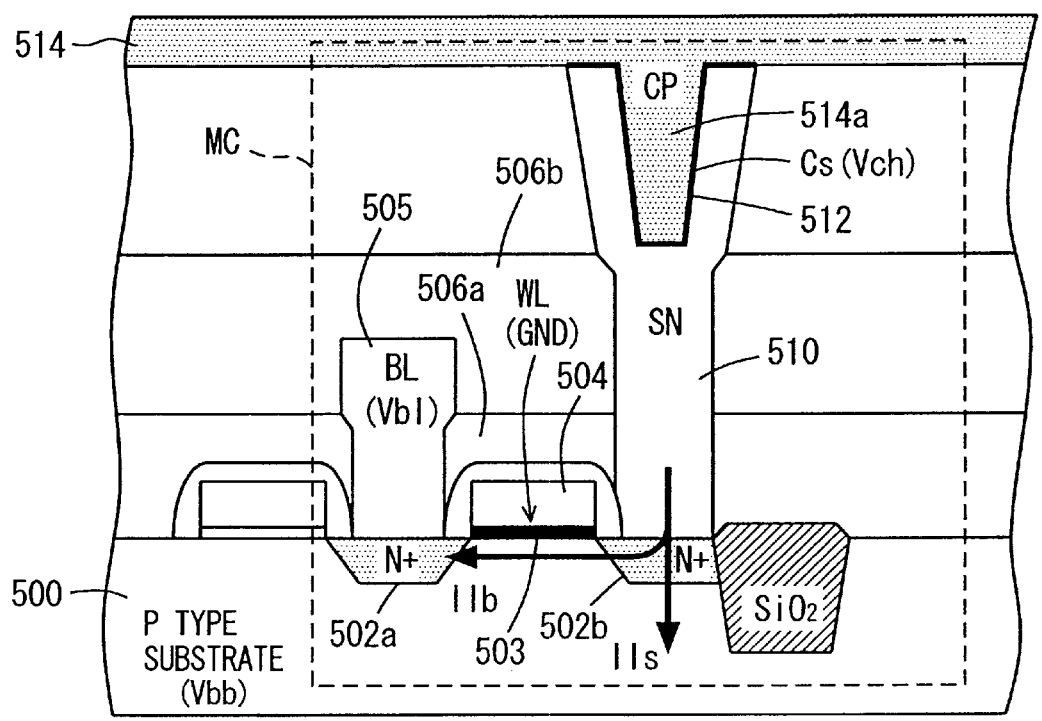
FIG. 16 schematically shows a cross sectional structure of a conventional DRAM cell.
Figure 17A:
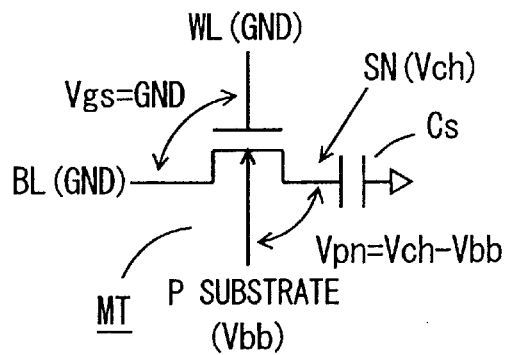
FIGS. 17A and 17B show a voltage applied to each node of the conventional DRAM cell and a voltage applied to each node of a memory cell in the BSG scheme arrangement, respectively.
Figure 17B:
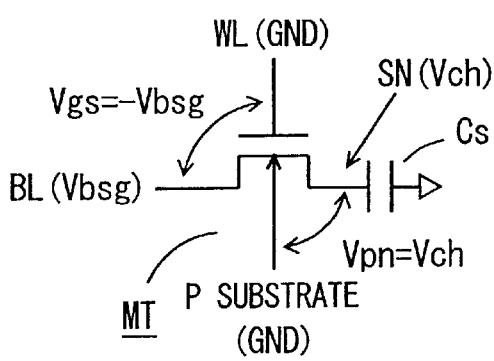

FIG. 15 schematically shows a structure of an internal voltage generating circuit according to the sixth embodiment of the invention. Referring to FIG. 15, an internal circuit 95 consumes an internal voltage Vin on an internal voltage line 90 when it operates. Internal circuit 95 is activated when an activation signal ACT is activated. According to the sixth embodiment, the level of voltage Vin on internal voltage line 90 is adjusted.

Referring to FIG. 15, the internal voltage generating circuit includes a reference voltage generating circuit 100 generating a reference voltage Vrf, a control voltage generating circuit 102 according to reference voltage Vrf from reference voltage generating circuit 100 to generate a control voltage Vdcn, a control voltage generating circuit 104 generating a control voltage Vdcp from reference voltage Vrf, a voltage adjustment circuit 106 according to a difference between control voltage Vdcn from control voltage generating circuit 102 and internal voltage Vin to adjust the level of internal voltage Vin, and a voltage adjustment circuit 108 according to a difference between control voltage Vdcp and internal voltage Vin to adjust the level of internal voltage Vin.

Control voltage Vdcn is equal to the sum of reference voltage Vrf and the threshold voltage Vthn of an N channel MOS transistor. Control voltage Vdcp is equal to the difference between reference voltage Vrf and the threshold voltage Vthp of a P channel MOS transistor. As the structures of reference voltage generating circuit 100 and control voltage generating circuit 102, any of the structures according to the first to the fourth embodiments may be employed. For control voltage generating circuit 104, the circuit structure according to the fifth embodiment is employed.

Voltage adjustment circuit 106 includes a difference detection MOS transistor 106a for flowing current according to the difference between control voltage Vdcn and internal voltage Vin, and a voltage compensation circuit 106b for converting current detected by MOS transistor 106a to a voltage to adjust the level of the internal voltage Vin according to the resultant voltage. Voltage compensation circuit 106b, having a structure similar to the structure according to the first embodiment, includes a capacitance element, a precharge circuit for precharging the capacitance element, a circuit for coupling the capacitance element with difference detection MOS transistor 106a, and a current drive transistor according to charged voltage of the precharged MOS capacitor (capacitance element) to supply current to the internal voltage line.

Voltage adjustment circuit 108 includes a difference detection P channel MOS transistor 108a for flowing current according to the difference between control voltage Vdcp and internal voltage Vin, and a voltage compensation circuit 108b for converting current flowing through the difference detection MOS transistor into voltage information and discharging the current from internal voltage line 90 to the ground node according to the resultant voltage information. Voltage compensation circuit 108b has a structure similar to that according to the modification of the fifth embodiment, and it includes a current drive transistor according to the difference between internal voltage Vin and control voltage Vdcp to set charged voltage of the capacitance element and supply current from internal voltage line 90 to the ground node according to the charged voltage of the capacitance element.

In the structure shown in FIG. 15, internal voltage Vin is not limited to the boosted sense ground voltage and may be a high level sense supply voltage or internally down-converted periphery supply voltage. A source of consuming internal voltage Vin would include, other than internal circuit 95 operating according to activation instruction signal ACT, a leakage source which is present all the time, and therefore, the structure shown in FIG. 15 may be employed for the purpose of stabilizing internal voltage Vin in the standby state, In the structure of the internal voltage generating circuit shown in FIG. 15, control voltage Vdcn has the level of Vrf+Vthn. MOS transistor 106a operates in the so-called "source-follower mode", and supplies current to internal voltage line 90 when internal voltage Vin becomes equal to or lower than reference voltage Vrf. Responsively, voltage compensation circuit 106b converts the supplied current by MOS transistor 106a into voltage information and supplies current to internal voltage line 90 according to the resultant information at high speed.

Control voltage Vdcp has the level of Vrf−Vthp. MOS transistor 108a, operating in the source-follower mode, is turned on when internal voltage Vin exceeds reference voltage Vrf to flow current. The current flowing through MOS transistor 108a is converted into voltage information by voltage compensation circuit 108b. According to the resultant voltage information, current is discharged from internal voltage line 90. Voltage adjustment circuits 106 and 108 thus maintain internal voltage Vin at the level of reference voltage Vrf.

According to the sixth embodiment of the invention as discussed above, internal voltage Vin is so controlled as to be equal to reference voltage Vrf and parameters of the transistors of the circuits for controlling the internal voltage do not affect the internal voltage. Consequently, regardless of the characteristics of the difference detection transistor, internal voltage Vin can be kept at a constant voltage level over a wide temperature or operation range.

Other Applications

The boosted sense ground voltage of the sense supply voltages of the DRAM is discussed as specific embodiments. However, as described in the sixth embodiment, the present invention is applicable to any structure in which the difference between the internal voltage and the control voltage is detected by means of current and the detected current is converted into voltage information and thereafter this converted voltage information is used for adjusting the level of the internal voltage. Therefore, the present invention is not restricted to an application to the DRAM.

As discussed above, according to the present invention, a contrivance is made so as to prevent characteristic parameters of the MOS transistor for detecting the internal voltage difference from affecting the level of the internal voltage. As a result, the internal voltage can be maintained at a constant voltage level in a wide operation range.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An internal voltage generating circuit comprising:

a reference voltage generating circuit for generating a reference voltage;

a comparator for comparing said reference voltage with a voltage on a first node to generate a signal indicating a result of comparison;

a current drive transistor coupled to a first power source node, for flowing a current between said second node and said first power source node in accordance with the signal outputted from said comparator;

an output circuit coupled between said current drive transistor and a second power source node, for converting the current flown by said current drive transistor into a voltage to generate a resultant voltage on said second node, said output circuit including a voltage drop element causing voltage drop between said second node and said first node; and a voltage compensation circuit according to a difference between a voltage on an internal voltage line and the voltage on said second node for causing a current flow between said internal voltage line and a third power source node, wherein said voltage drop element is a first diode-connected insulated gate field effect transistor;

said voltage compensation circuit comprises a voltage difference detection element varying in conductance according to a difference between the voltage on said second node and the voltage on said internal voltage line, to detect said difference, a circuit for generating a voltage on an internal node according to the voltage difference detected by said voltage difference detection element, and a drive element according to the voltage on said internal node for causing a current flow between said internal voltage line and said third power supply node; and said voltage difference detection element is a second insulated gate field effect transistor being the same in conductivity type as said first insulated gate field effect transistor, and said second insulated gate field effect transistor operates in a source follower mode.

2. An internal voltage generating circuit according:

a reference voltage generating circuit for generating a reference voltage;

a comparator for comparing said reference voltage with a voltage on a first node to generate a signal indicating a result of comparison;

a circuit drive transistor coupled to a first power source node, for flowing a current between a second node and said first power source node in accordance with the signal outputted from said comparator;

an output circuit coupled between said current drive transistor and a second power source node, for converting the current flown by said current drive transistor into a voltage to generate a resultant voltage on said first node, said output circuit including a voltage drop element causing voltage drop between said second node and said first node; and a voltage compensation circuit according to a difference between a voltage on an internal voltage line and the voltage on said second node for causing a current flow between said internal voltage line and a third power source node, wherein said reference voltage generating circuit includes a first capacitance element, a second capacitance element, precharge circuitry responsive to a clock signal for storing electrical charges in the first and second capacitance elements, and equalize circuitry rendered conductive complementarily to said precharge circuitry in response to said clock signal, for electrically coupling said first and second capacitance elements to an output node; and said reference voltage is generated on said output node.

3. The internal voltage generating circuit according to claim 1, wherein said output circuit further includes a capacitance element coupled between said voltage drop element and said second power source node.

4. The internal voltage generating circuit according to claim 2, further comprising an oscillation circuit for generating said clock signal, said oscillation circuit including a circuit for shortening a cycle of said clock signal in a transition period from a non-steady state to a steady state.

5. The internal voltage generating circuit according to claim 2, further comprising a resistance voltage division circuit coupled to said output node in a transition period from a non-steady state to a steady state, to produce a divided voltage on the output node when coupled to the output node.

6. An internal voltage generating circuit comprising:

a first capacitance element;

a second capacitance element;

a precharge circuit responsive to a clock signal, for storing electrical charges in the first and second capacitance elements; and an equalize circuit being activated complementarily to said precharge circuit in response to said clock signal, for electrically coupling said first and second capacitance elements to an output node, a reference voltage being generated on said output node.

7. The internal voltage generating circuit according to claim 6, further comprising an oscillation circuit for generating said clock signal, said oscillation circuit including a circuit for shortening a cycle of said clock signal in a transition period from a non-steady state to a steady state.

8. The internal voltage generating circuit according to claim 6, further comprising a resistance voltage division circuit coupled to said output node in a transition period from a non-steady state to a steady state, to produce a divided voltage on the output node when coupled to the output node.

9. The internal voltage generating circuit according to claim 6, further comprising:

a comparator for comparing the reference voltage on said output node with a voltage on a first internal node;

a current drive element responsive to an output signal of said comparator for causing a flow of a current between a second internal node and a first power supply node;

a voltage drop element coupled between said first and second internal nodes, for causing a voltage drop between the first and second internal nodes; and a conversion element coupled between said voltage drop element and a second power source node, for converting the current caused by said current drive element into a voltage to generate a voltage corresponding to a resultant voltage on said second internal node.

10. The internal voltage generating circuit according to claim 9, wherein said conversion element includes a capacitance element.

11. An internal voltage generating circuit comprising:

an internal voltage line for transmitting an internal voltage;

a difference detection transistor for generating a current according to a difference between a control voltage and said internal voltage;

a capacitance element having a charged voltage determined according to the current generated by said difference detection transistor;

a current drive transistor according to the charged voltage of said capacitance element, for causing a flow of a current between said internal voltage line and a power source node; and a control voltage generating circuit for generating said control voltage, said control voltage generating circuit generating said control voltage so as to cancel temperature dependency exhibited by the voltage on said internal voltage line through said difference detection transistor.

12. The internal voltage generating circuit according to claim 11, wherein said difference detection transistor is an insulated gate field effect transistor operating in a source-follower mode, and said control voltage generating circuit generates said control voltage so as to cancel an influence of a threshold voltage of said insulated gate field effect transistor on a voltage level of said internal voltage.

13. The internal voltage generating circuit according to claim 2, wherein said precharge circuit includes a first precharge element responsive to said clock signal, for coupling said first capacitance element to a first power source node, and a second precharge element responsive to said clock signal, for coupling said second capacitance element to a second power source node.

14. The internal voltage generating circuit according to claim 6, wherein said precharge circuit includes a first coupling element responsive to the clock signal for coupling said first capacitance element to a first power source node supplying a first power source voltage, and a second coupling element responsive to the clock signal for coupling said second capacitance element to a second power source node supplying a second power source voltage different in logic level from said first power source voltage.

* * * * *